US012660392B2

(12) United States Patent (10) Patent No.: US 12,660,392 B2
Gu et al. (45) Date of Patent: Jun. 16, 2026

(54) DISPLAY PANEL AND DISPLAY APPARATUS

(71) Applicant: WUHAN TIANMA MICRO-ELECTRONICS CO., LTD., Wuhan (CN)

(72) Inventors: Jiachang Gu, Wuhan (CN); Chujie Yu, Wuhan (CN); Tao Peng, Wuhan (CN); Kang Yang, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 620 days.

(21) Appl. No.: 18/166,662

(22) Filed: Feb. 9, 2023

(65) Prior Publication Data

US 2023/0178704 A1 Jun. 8, 2023

(30) Foreign Application Priority Data

Sep. 6, 2022 (CN) .......................... 202211086346.9

(51) Int. Cl.
*H01L 33/62* (2010.01)
*H10H 20/857* (2025.01)

(52) U.S. Cl.
CPC ................................ *H10H 20/857* (2025.01)

(58) Field of Classification Search
CPC ......... H10H 20/857; G09G 2300/0426; G09G 2300/0819; G09G 2300/0861; G09G 2310/0251; G09G 2310/0262; G09G 2320/043; G09G 3/3233; H10K 59/121; H10K 59/131
See application file for complete search history.

(56) References Cited

U.S. PATENT DOCUMENTS

2020/0013849 A1* 1/2020 Kim ..................... H10K 59/123

FOREIGN PATENT DOCUMENTS

| CN | 109541867 A | | 3/2019 | |
| CN | 109637372 A | | 4/2019 | |
| CN | 111435677 A | | 7/2020 | |
| CN | 112599580 A | * | 4/2021 | .......... H10K 59/126 |
| CN | 113540120 A | | 10/2021 | |

OTHER PUBLICATIONS

English Translation of the First Chinese Office Action mailed on May 10, 2023, issued in corresponding Chinese App. No. 2022110863469, filed Sep. 6, 2022, 11 pages.

* cited by examiner

*Primary Examiner* — Elmito Breval
(74) *Attorney, Agent, or Firm* — CHRISTENSEN O'CONNOR JOHNSON KINDNESS PLLC

(57) ABSTRACT

A display panel and a display apparatus are described. In an embodiment, the display panel includes a display region having a through hole, a first signal line and a first connection line both located in the display region. In an embodiment, the first signal line is interrupted by the through hole. In an embodiment, one end of the first connection line is connected to a first segment of the first signal line, another end of the first connection line is connected to a second segment of the first signal line, and the first and second segments are located two sides of the through hole. In an embodiment, the first connection line includes a first connection segment and a second connection segment that have different extending directions, and at least one of the first connection segment and the second connection segment is in a different layer from the first signal line.

20 Claims, 11 Drawing Sheets

DISPLAY PANEL AND DISPLAY APPARATUS

CROSS-REFERENCE TO RELATED APPLICATION

The present disclosure claims priority to Chinese Patent Application No. 202211086346.9, filed on Sep. 6, 2022, the content of which is incorporated herein by reference in its entirety.

TECHNICAL FIELD

The present disclosure relates to the field of display technologies, and in particular, to a display panel and a display apparatus.

BACKGROUND

In order to pursue a narrow frame and improve the user's visual experience, solutions such as "notched screen", "water drop screen", and "infinity-o screen" have emerged. In the "infinity-o screen", a hole is formed in a display region. During assembling of a display module, an optical device is provided in the hole. However, due to the presence of the hole, signal lines in the display region are cut by the hole. Conventionally, in order to ensure normal signal transmission, it is necessary to provide a detour line in a non-display region surrounding the hole, so that a width of the non-display region surrounding the hole is too large, affecting the display effect.

SUMMARY

A first aspect of the present disclosure provides a display panel. In an embodiment, the display panel includes a display region having a through hole, a first signal line; and a first connection line. In an embodiment, the first signal line extends in the display region and is interrupted by the through hole into a first segment and a second segment located on two sides of the through hole respectively. In an embodiment, the first connection line is located in the display region. In an embodiment, a first end of the first connection line is connected to the first segment of the first signal line, and a second end of the first connection line is connected to the second segment of the first signal line. In an embodiment, the first connection line has a first connection segment and a second connection segment that have different extending directions, and at least one of the first connection segment or the second connection segment is located in a layer different from the first signal line.

A second aspect of the present disclosure provides a display panel. In an embodiment, the display panel includes a display region having a through hole, a through-hole non-display region, a first signal line and a second signal line, a first connection line located in the display region, and a second connection line located in the through-hole non-display region. In an embodiment, the through-hole non-display region surrounds the through hole, and the display region surrounds the through-hole non-display region. In an embodiment, both the first signal line and the second signal line extend in the display region and are interrupted by the through-hole non-display region. In an embodiment, a first end of the first connection line is connected to a first segment of the first signal line, a second end of the first connection line is connected to a second segment of the first signal line, and the first segment and the second segment of the first signal line are located on two sides of the through hole, respectively. In an embodiment, a first end of the second connection line is connected to a first segment of the second signal line, a second end of the second connection line is connected to a second segment of the second signal line, and the first segment and the second segment of the second signal line are located on two sides of the through hole, respectively.

A third aspect of the present disclosure provides a display apparatus. In an embodiment, the display apparatus includes the display panel in the first aspect and the second aspect.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings.

DESCRIPTION OF EMBODIMENTS

In order to more clearly illustrate objectives, technical solutions, and advantages of the embodiments of the present disclosure, the technical solutions in the embodiments of the present disclosure are clearly and completely described in details with reference to the accompanying drawings. Obviously, the described embodiments are merely part of the embodiments of the present disclosure rather than all of the embodiments. All other embodiments obtained by those skilled in the art based on the embodiments of the present disclosure without paying creative labor shall fall into the protection scope of the present disclosure.

The terms used in the embodiments of the present disclosure are merely for the purpose of describing specific embodiment, rather than limiting the present disclosure. The terms "a", "an", "the" and "said" in a singular form in the embodiment of the present disclosure and the attached claims are also intended to include plural forms thereof, unless noted otherwise.

An aspect of the present disclosure provides a display panel. In an embodiment, a through hole is provided in a display region of the display panel. The display panel has a multi-layer stacking structure. In an embodiment, the through hole penetrates at least some layers of the display panel. As a result, a region where the through hole is located has no pixels, and does not have the display function. Some functional devices, such as cameras and other photosensitive devices, may be arranged in the region where the through hole is located, so that arrangement of these devices does not occupy the frame of the display panel, which can reduce the frame width of the display panel. Due to the presence of the through hole, the signal line in the display region may be interrupted by the through hole. In order to provide the normal signal transmission, a detour line in the non-display region surrounding the through hole is provided, so that the width of the non-display region surrounding the through hole is too large, thereby affecting the display effect. The present disclosure provides a display panel capable of reducing the width of the non-display region surrounding the through hole.

Figure 1:
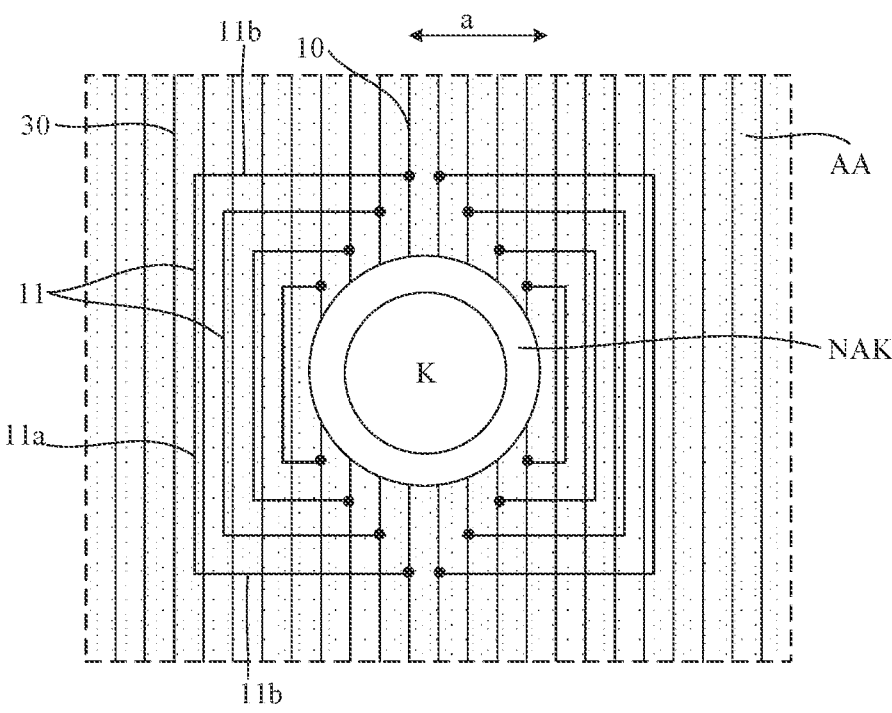
FIG. 1 is a schematic diagram of a display panel according to an embodiment of the present disclosure.

FIG. 1 is a schematic diagram of a display panel according to an embodiment of the present disclosure. As shown in FIG. 1, the display panel includes a display region AA having a through hole K, and a through-hole non-display region NAK (also referred to as a third non-display region in the present disclosure) surrounding the through hole K. The display region AA surrounds the through-hole non-display region NAK. The embodiments of the present disclosure do not limit the position of the through hole K in the display region AA and the shape of the through hole K. A circle shape through hole K is illustrated as an example in the drawings. Multiple light-emitting elements are arranged in the display region AA. The light-emitting element may be an organic light-emitting element or an inorganic light-emitting device. Some circuit lines (such as crack detection lines), encapsulation blocking walls, partition structures or the like are arranged in the through-hole non-display region NAK. The through-hole non-display region NAK between the through-hole K and the display region AA has a certain width.

The display panel includes first signal lines 10 and first connection lines 11. The first signal lines 10 extend in the display region AA and are interrupted by the through hole K. Each first signal line 10 has a first segment and a second segment located on two sides of the through hole K. For example, the first segment terminates at a position in the display region on one side of the through hole K, and the second segment terminates at a position in the display region on an opposite side of the through hole K. The first connection lines 11 are located in the display region AA. Each first connection line 11 has a first end connected to the first segment of one first signal line 10, and a second end connected to the second segment of one first signal line 10. Multiple pixels (such as light-emitting elements) are arranged in the display region AA. The pixel is electrically connected to a pixel circuit for driving the pixel to emit light. The pixel circuits in the display panel are arranged in an array, for example, the pixel circuits are arranged in rows and columns. Each first signal line is electrically connected to pixel circuits located in a same pixel circuit row or a same pixel circuit column. The first segment and the second segment of the first signal line 10 are connected to each other by the first connection line 11, so as to be connected to pixel circuits located in a same pixel circuit row or a same pixel circuit column, and transmit the same signal.

The display region AA further includes a first conventional signal line 30 extending in the same direction as the first signal line 10. The first conventional signal line 30 passes through the display region AA, that is, the first conventional signal line 3 is not interrupted by the through hole K. In some embodiments, the first conventional signal line 30 transmit the same type of signal as the first signal line 10.

As shown in FIG. 1, the first connection line 11 includes a first connection segment 11a and a second connection segment 11b that have different extending directions. At least one of the first connection segment 11a or the second connection segment 11b is located in a different layer from the first signal line 10. The shape of the first connection line 11 is approximately a "U"-shaped line, so that the first and second segments of the first signal line 10 located on two sides of the through hole K can be connected. The "extending direction" of the line or segment in the embodiments of the present disclosure refers to the running direction of the line or segment, and the line or segment are not limited to a straight line. Both the first connection segment 11a and the second connection segments 11b in FIG. 1 are shown as straight lines. In some embodiments, the first connection segment 11a and the second connection segments 11b may be curved lines or broken lines.

In the embodiments of the present disclosure, the first signal line 10 in the display region AA is broken by the through hole K into a first segment and a second segment, and the first segment and the second segment of the first signal line 10 located on two sides of the through hole K are connected by the first connection line 11 located in the display region AA, to provide the electrical connection between the first segment and the second segment of the first signal line 10 corresponding to the same pixel circuit column or the same pixel circuit row. Providing the first connection line 11 in the display region AA does not occupy the space of the through-hole non-display region NAK surrounding the through-hole K, so that it is beneficial to narrowing the through-hole non-display region NAK, thereby improving the display effect. Moreover, since the first connection line 11 is arranged in the display region AA, the length of the first connection line 11 is relatively long. Since no pixel is arranged in the through hole K, the pixel circuits connected to the first signal line 10 is fewer than the pixel circuits connected to the first conventional signal line 30. With the long first connection line 11, the load on the first signal line 10 can be increased to compensate for the influence on the load of the first signal line 10 caused by lacking pixels at the position of the through hole K, and the load difference between the first signal line 10 and the first conventional signal line 30 can be reduced, thereby improving the display uniformity. In addition, with the arrangement that at least one of the first connection segment or the second connection segment of the first connection line 11 is located in a layer different from the layer of the first signal line 10, occupancy of the first connection line 11 to the original layers of the display panel (for example, the layer where the first signal line 10 is located) can be reduced, so that the density of the pixel circuits in the display panel can be provided, and the density of display pixels is not affected.

In some embodiments, as shown in FIG. 1, each first connection line 11 is arranged on one side of the through hole K. For example, the through hole K has a first side and a second side along a first direction a, the first connection lines 11 include a first connection line located on the first side of the through hole K and a first connection line located on the second side of the through hole K, and a number of the first connection line located on the first side of the through hole K is equal to a number of the first connection line located on the second side of the through hole K. The first direction a and the extending direction of the first signal line 10 intersect each other. It should be noted that the first direction shown in FIG. 1 is a row direction, but the present disclosure is not limited thereto. For example, the first signal line 10 is a scan line extending in a row direction, the first direction may be a column direction. For another example, the first signal line 10 is a data line extending in a column direction, and the first direction may be a row direction. The first connection line 11 located in the display region AA can reflect ambient light, which affect the reflectivity of the display panel. In the embodiments of the present disclosure, the number of the first connection line 11 located on the first side of the through hole K is equal to the number of the first connection line 11 located on the second side of the through hole K, it helps to realize the symmetrical arrangement of the first connection lines 11 on two sides of the through hole K, improve the uniformity of the layout of the first connection lines 11 in the display region AA, and avoid the large difference in reflectivity of the display region AA on two sides of the through hole K. The large reflectivity difference affects the display effect.

Figure 2:
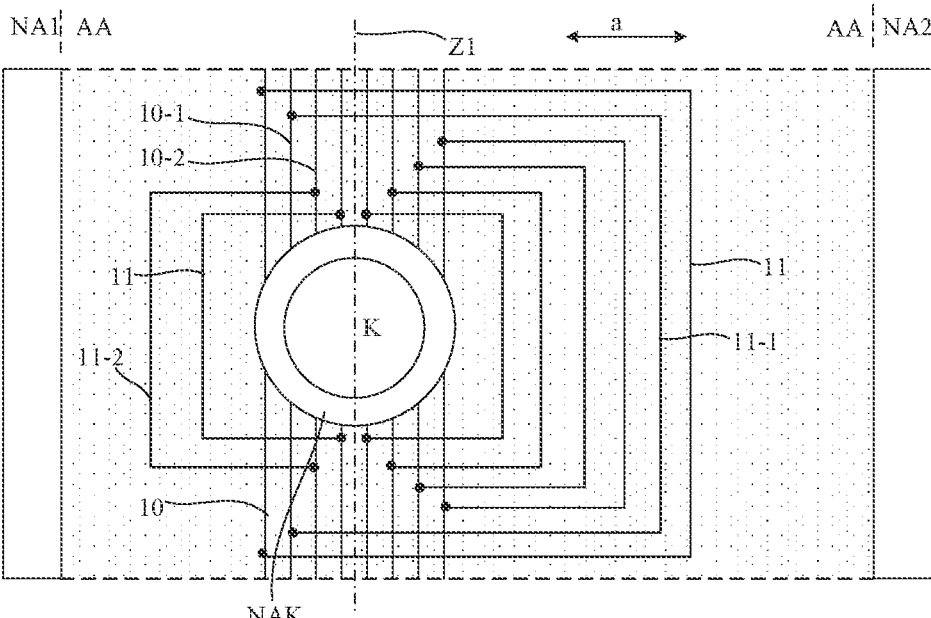
FIG. 2 is a schematic diagram of a display panel according to another embodiment of the present disclosure.

FIG. 2 is a schematic diagram of a display panel according to another embodiment of the present disclosure. The signal lines in FIG. 2 are illustrated in a simplified manner, and the conventional signal lines in the display region AA that are not broken by the through hole K are not illustrated. In some embodiments, as shown in FIG. 2, the through hole K has a first side and a second side along the first direction a, the first connection lines 11 include a first connection line located on the first side of the through hole K and a first connection line located on the second side of the through hole K, and a number of the first connection line located on the first side of the through hole K is different from a number of the first connection line located on the second side of the through hole K. The first direction a and the extending direction of the first signal line 10 intersect each other. The number of the first connection line located on the first side of the through hole K and the number of the first connection line located on the second side of the through hole K can be designed according to the difference in the sizes of the display region AA on the first and second sides of the through hole along the first direction a. In this way, the space of the display region AA is rationally utilized to realize that the first connection lines 11 are arranged in the display region AA, thereby reducing the width of the through-hole non-display region NAK.

As shown in FIG. 2, the display panel further includes a first non-display region NA1 and a second non-display region NA2. Along the first direction a, the first non-display region NA1 and the second non-display region NA2 are respectively located on two sides of the display region AA. Along the first direction a, a distance between the through hole K and the first non-display region NA1 is smaller than a distance between the through hole K and the second non-display region NA2. Therefore, the width of the display region AA between the through hole K and the first non-display region NA1 along the first direction a is smaller than the width of the display region AA between the through hole K and the second non-display region NA2 in the first direction a. The first connection lines 11 include a first connection line 11 detouring between the first non-display region NA1 and the through hole K and a first connection line 11 detouring between the second non-display region NA2 and the through hole K. The number of first connection line 11 detouring between the first non-display region NA1 and the through hole K is n1, the number of first connection line 11 detouring between the second non-display region NA2 and the through hole K is n2, and n1<n2. Fewer first connection lines 11 are arranged in the display region AA between the first non-display region NA1 and the through hole K to adapt to the space size of the display region AA between the first non-display region NA1 and the through hole K. Moreover, it is helps to realize the uniformity of the layout density of the first connection lines 11 in the display region AA on two sides of the through hole K in the first direction a, and avoid the excessive large density of the first connection lines 11 arranged on one side of the through hole K, which renders a large difference in the reflectivity of the display region AA on two sides of the through hole K and affects the display effect.

In some embodiments, as shown in FIG. 2, the first signal lines 10 include a first A-type signal line 10-1 and a first B-type signal line 10-2, and the first connection lines 11 include a first type-A connection line 11-1 and a first type-B connection line 11-2. The first segment and the second segment of the first A-type signal line 10-1 located on two sides of the through hole K are connected by the first type-A connection line 11-1, and the first segment and the second segment of the first B-type signal line 10-2 located on two sides of the through hole K are connected by the first type-B connection line 11-2. The through hole K has a first symmetry axis Z1, and the first symmetry axis Z1 is parallel to the extending direction of the first signal line 10. For example, the extending direction of the first symmetry axis Z1 is the same as the extending direction of the first signal line 10. Both the first A-type signal line 10-1 and the first B-type signal line 10-2 are located on a side of the first symmetry axis Z1 adjacent to the first non-display region NA1. Along the first direction a, a distance between the first A-type signal line 10-1 and the first non-display region NA1 is smaller than a distance between the first B-type signal line 10-2 and the first non-display region NA1. The first type-A connection line 11-1 is arranged between the through hole K and the second non-display region NA2. The first type-B connection line 11-2 is arranged between the through hole K and the first non-display region NA1. Since the distance between the first A-type signal line 10-1 and the first non-display region NA1 in the first direction a is smaller than the distance between the first B-type signal line 10-2 and the first non-display region NA1 in the first direction a, the total length of the first segment and the second segment of the first A-type signal line 10-1 on two sides of the through hole K is larger than the total length of the first segment and the second segment of the first B-type signal line 10-2. However, detouring the display region between the through hole K and the second non-display region NA2 can increase the length of the first type-A connection line 11-1, thereby increasing the resistance of the first type-A connection line 11-1, i.e., increasing the load on the first A-type signal line 10-1. Therefore, the load difference between the first A-type signal line 10-1 and the first B-type signal line 10-2 is reduced to improve the display uniformity.

In other embodiments (not shown by the drawings), the first connection lines 11 are all arranged in the display region AA between the second non-display region NA2 and the through hole K. Such a configuration can use the larger display region AA between the through hole K and the second non-display region NA2 to increase the length of each first connection line 11, i.e., increasing the load on the first A-type signal line 10-1 to compensate for the influence of lacking pixels at the position of the through hole K on the load of the first signal line 10.

In some embodiments, one of the first connection segment 11a and the second connection segment 11b is located in a same layer as the first signal line 10. As shown in FIG. 1, the extending direction of the first connection segment 11a is the same as the extending direction of the first signal line 10, so that the first connection segment 11a and the first signal line 10 can be located in a same layer, and the first connection segment 11a and the first signal line 10 can be manufactured in the same manufacturing step. The second connection segment 11b and the first signal line 10 are located in different layers, and the second connection segment 11b can be manufactured in the same manufacturing step as other functional structures in the display panel, or an additional conductive layer is added to the panel to manufacture the second connection segment 11b.

In other embodiments, the second connection segment 11b and the first signal line 10 are located in a same layer, and the first connection segment 11a and the first signal line 10 are located in different layers.

The display panel provided by the embodiments of the present disclosure includes functional signal lines. The functional signal lines at least include data lines and gate lines that drive the pixel circuit to work. Depending on the structure of the pixel circuit, the functional signal lines further include power supply signal lines, reset signal lines, emission control lines, and the like. In some embodiments, the pixel circuit includes x transistors T and y capacitors C, where x and y are positive integers. For example, the pixel circuit is a 2T1C circuit, a 7T1C circuit or an 8T1C circuit.

Figure 3:
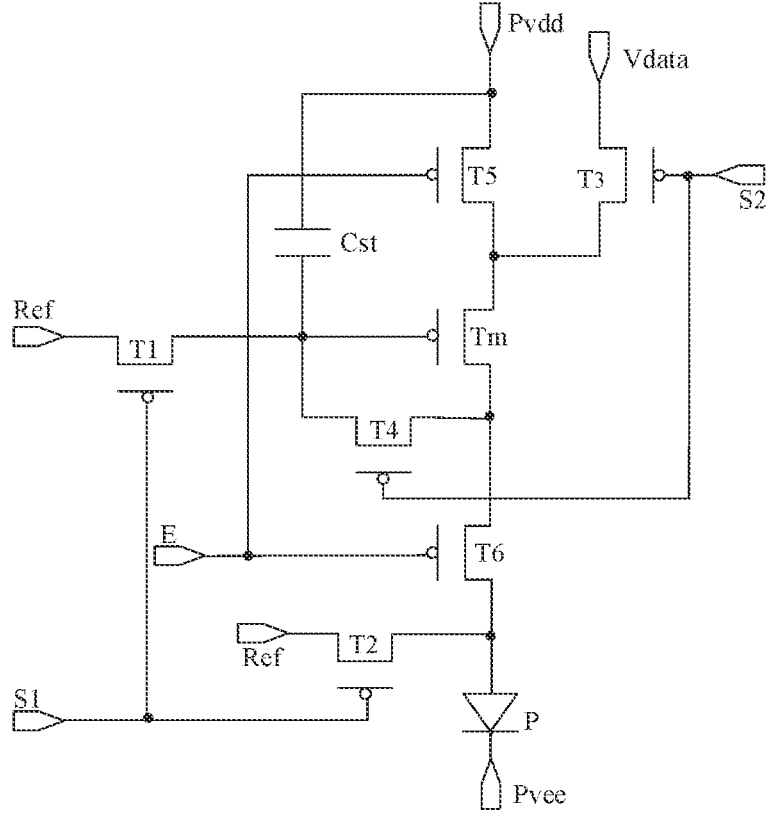
FIG. 3 is a schematic diagram of a pixel circuit in a display panel according to another embodiment of the present disclosure.

Taking the 7T1C circuit as an example, FIG. 3 is a schematic diagram of a pixel circuit in a display panel according to another embodiment of the present disclosure. As shown in FIG. 3, the pixel circuit includes a driving transistor Tm, a gate reset transistor T1, an electrode reset transistor T2, a data writing transistor T3, a threshold compensation transistor T4, a first emission control transistor T5, a second emission control transistor T6, and a storage capacitor Cst. A first electrode of the gate reset transistor T1 receives a reset signal Ref, a second electrode of the gate reset transistor T1 is connected to the gate electrode of the driving transistor Tm, and a gate electrode of the gate reset transistor T1 receives a first scan signal S1. A first electrode of the data writing transistor T3 receives a data signal Vdata, and a second electrode of the data writing transistor T3 is connected to the first electrode of the driving transistor Tm. The threshold compensation transistor T4 is connected in series between the gate electrode and the second electrode of the driving transistor Tm. The gate electrode of the data writing transistor T3 and the gate electrode of the threshold compensation transistor T4 each receive a second scan signal S2. The driving transistor Tm is connected in series between the first emission control transistor T5 and the second emission control transistor T6. A gate electrode of the first emission control transistor T5 and a gate electrode of the second emission control transistor T6 each receive an emission control signal E. In addition, a first plate of the storage capacitor Cst and a first electrode of the first emission control transistor T5 receive a positive power supply signal Pvdd, a second electrode of the second emission control transistor T6 is connected to a first electrode of a light-emitting element P, and a second electrode of the light-emitting element P receive the negative power supply signal Pvee. A first electrode of the electrode reset transistor T2 receives the reset signal Ref, a second electrode of the electrode reset transistor T2 is connected to the first electrode of the light-emitting element P, and the gate electrode of the electrode reset transistor T2 receives the first scan signal S1.

The data line provides the data signal Vdata. The gate line includes at least a first scan line, a second scan line, and an emission control line. The first scan line provides the first scan signal S1, the second scan line provides the second scan signal S2, and the emission control line provides the emission control signal E. The power supply signal line provides the positive power supply signal Pvdd. The reset signal line provides the reset signal Ref.

In FIG. 3, each transistor in the pixel circuit is a p-type transistor. In another embodiment, each transistor in the pixel circuit is an n-type transistor, which is not illustrated in the drawings.

In FIG. 3, the gate reset transistor T1 and the electrode reset transistor T2 receive the same reset signal Ref. In another embodiment, the gate reset transistor T1 receives a first reset signal, the electrode reset transistor T2 receives a second reset signal, and the voltage of the first reset signal is different from the voltage of the second reset signal, which are not shown in the drawings here.

In addition, the pixel circuit illustrated in FIG. 3 includes the electrode reset transistor T2, and in other embodiments, the pixel circuit does not include the electrode reset transistor T2. In other embodiments, the pixel circuit does not include the gate reset transistor T1. In other embodiments, the pixel circuit does not include the threshold compensation transistor T4.

In another embodiment, one of the gate reset transistor T1 and the threshold compensation transistor T4 is an n-type transistor, and the other of the gate reset transistor T1 and the threshold compensation transistor T4 is a p-type transistor. One of the gate reset transistor T1 and the threshold compensation transistor T4 includes metal oxide, and the other of the gate reset transistor T1 and the threshold compensation transistor T4 includes silicon.

Figure 4:
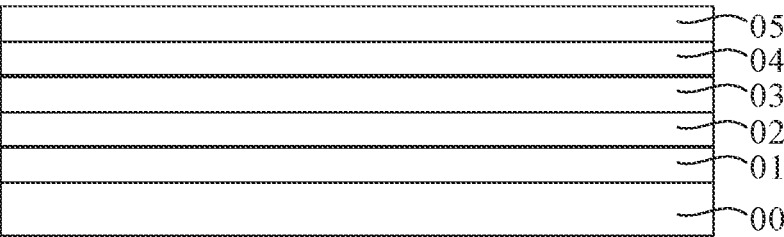
FIG. 4 is a schematic diagram of a layer structure of a display panel according to another embodiment of the present disclosure.

FIG. 4 is a schematic diagram of a layer structure of a display panel according to another embodiment of the present disclosure, and FIG. 4 simplifies the number of metal layers included in the display panel and the positional relationship of each metal layer relative to the substrate. In some embodiments, as shown in FIG. 4, the display panel includes a first metal layer 01, a second metal layer 02, a third metal layer 03, a fourth metal layer 04 and a fifth metal layer 05, which are located on a side of the substrate 00 and are arranged away from the substrate 00 in sequence. The metal layers are insulated by insulating layers, and the metal layer and the substrate are insulated by an insulating layer. In some embodiments, the gate line and the emission control line are located in the first metal layer 01, the reset signal line is located in the second metal layer 02, and the power supply signal line is located in the third metal layer 03.

In some embodiments, the first signal line 10 is a data line, and the first signal line 10 and the first connection segment 11a are located in a same layer. The first connection segment 11a and the first signal line 10 are located in the fifth metal layer 05, and the second connection segment 11b is located in the fourth metal layer 04. When the first signal line 10 transmits a data signal, the data signal is sensitive to the coupling effect of other signals, so that the data signal affected by the coupling effect greatly affects the display effect. In some embodiments, the first signal line 10 in the display region AA is located in the fifth metal layer 05, so that a distance between the first signal line 10 and other metal layers is relatively large, and the coupling between the first signal line 10 and other signal lines can be reduced, thereby reducing the influence of the coupling effect on the data signal.

In other embodiments, the first signal line 10 and the first connection segment 11a are located in a same layer. The first connection segment 11a and the first signal line 10 are located in the fourth metal layer 04, and the second connection segment 11b is located in the fifth metal layer 05.

In other embodiments, the first connection segment 11a and the second connection segment 11b are located in a different layer from the first signal line 10, and the first connection segment 11a and the second connection segment 11b are located in a same layer. Since the extending direction of the first connection segment 11a and the extending direction of the second connection segment 11b intersect each other, if the first connection segment 11a and the second connection segment 11b are arranged in the same layer as the original signal line in the panel, the first connection line 11 can be short-circuited with the original signal line in the panel. In some embodiments of the present disclosure, an additional layer can be added to the display panel to manufacture the first connection segment 11a and the second connection segment 11b, so that the first connection line 11 does not occupy the original layer of the display panel, ensuring the density of the pixel circuits in the display panel, and ensuring that the density of display pixels is not affected.

In some embodiments, the first connection segment 11a and the second connection segment 11b are located on the fifth metal layer 05.

Figure 5:
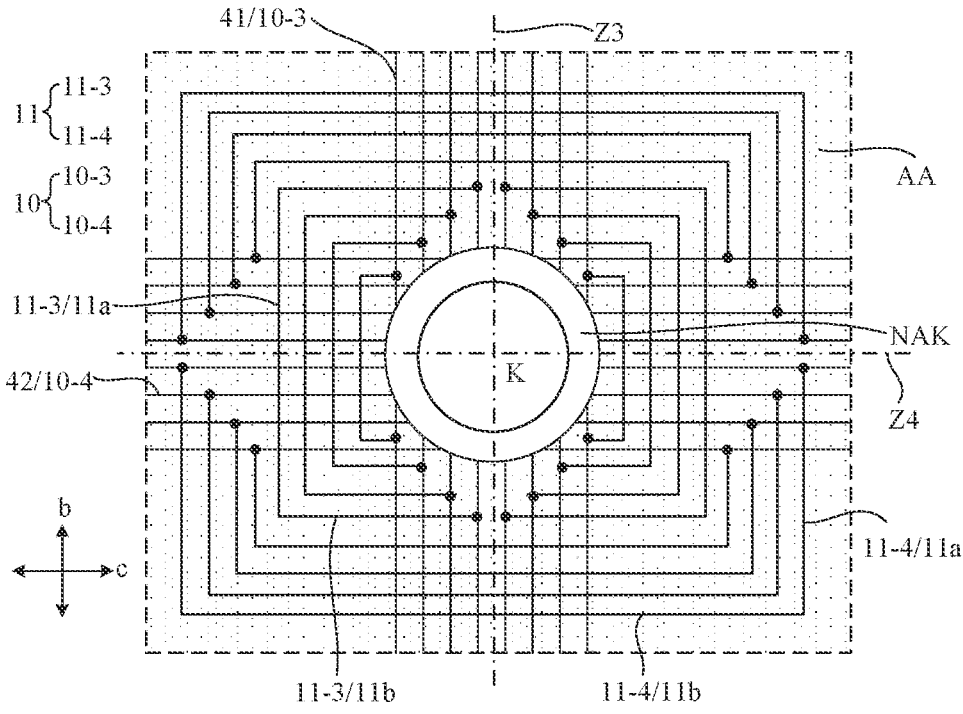
FIG. 5 is a schematic diagram of a display panel according to another embodiment of the present disclosure.

FIG. 5 is a schematic diagram of a display panel according to another embodiment of the present disclosure. In some embodiments, as shown in FIG. 5, the first connection segment 11a of the first connection line 11 extends along a second direction b, and the second connection segment 11b extends along a third direction c, where the second direction b and the third direction c intersect each other. The display panel includes data lines 41 extending along the second direction b and gate lines 42 extending along the third direction c, that is, the extending direction of the data lines 41 and the extending direction of the gate lines 42 intersect each other. Due to the presence of the through hole K in the display region AA, some data lines 41 are cut by the through hole K, and some gate lines 42 are cut by the through hole K. In FIG. 5, only the data lines 41 and the gate lines 42 that are cut by the through hole K are shown, and the data lines and gate lines that are not cut by the through hole K are not shown.

The first signal lines 10 include a first type-C signal line 10-3 and a first type-D signal line 10-4. The first connection lines 11 include a first type-C connection line 11-3 and a first type-D connection line 11-4. The through hole K has a first side and a second side along the third direction c, and a third side and a fourth side along the second direction b. The first type-C signal line 10-3 is the data line 41, and the third sub-connection line 11-3 connects the first segment and segment of the first type-C signal line 10-3 on two sides of the through hole K. The first type-D signal line 10-4 is the gate line 42, and the fourth sub-connection line 11-4 connects the first segment and the second segment of the first type-D signal line 10-4 located on two sides of the through hole K. The first type-C connection line 11-3 and the first type-D connection line 11-4 each include a first connection segment 11a and a second connection segment 11b, and the extending direction of the first connection segment 11a and the extending direction of the second connection segment 11b intersect each other.

The first connection segment 11a in the first type-C connection line 11-3 has the same extending direction as the first type-C signal line 10-3. The second connection segment 11b in the first type-D connection line 11-4 has the same extending direction as the first type-D signal line 10-4. The first connection segment 11a of the first type-C connection line 11-3 and the first connection segment 11a of the first type-D connection line 11-4 are located in a same layer, and the second connection segment 11b of the first type-C connection line 11-3 and the second connection segment 11b of the first type-D connection line 11-4 is located in a same layer.

In some embodiments, the first segment and the second segment of the data line 41 located on two sides of the through hole K are connected to each other through the first type-C connection line 11-3 detouring in the display region AA, and the first segment and the second segment of the gate line 42 located on two sides of the through hole K are connected to each other through the first type-D connection line 11-4 detouring in the display region AA. Neither the first type-C connection line 11-3 nor the first type-D connection line 11-4 occupies the space of the through-hole non-display region NAK, which is beneficial to narrow the border of the third hole non-display region NAK, thereby improving the display effect. In addition, the connection segments with the same extending direction in the first type-C signal line 10-3 and the first type-D signal line 10-4 are located in a same layer, which provides that the first type-C signal line 10-3 and the first type-D signal line 10-4 are insulated with each other, and the connection segments located in a same layer can be manufactured in the same manufacturing step, which is beneficial to simplifying the manufacturing process.

In some embodiments, the display panel includes a fixed-potential signal line. In a direction perpendicular to the plane of the substrate 00, the first connection line 11 at least partially overlaps the fixed-potential signal line. Such a configuration can reduce the coupling caused by overlapping of the first connection line 11 and the signal line, and reduce the influence of the coupling on the signal transmitted on the first connection line 11.

Figure 6:
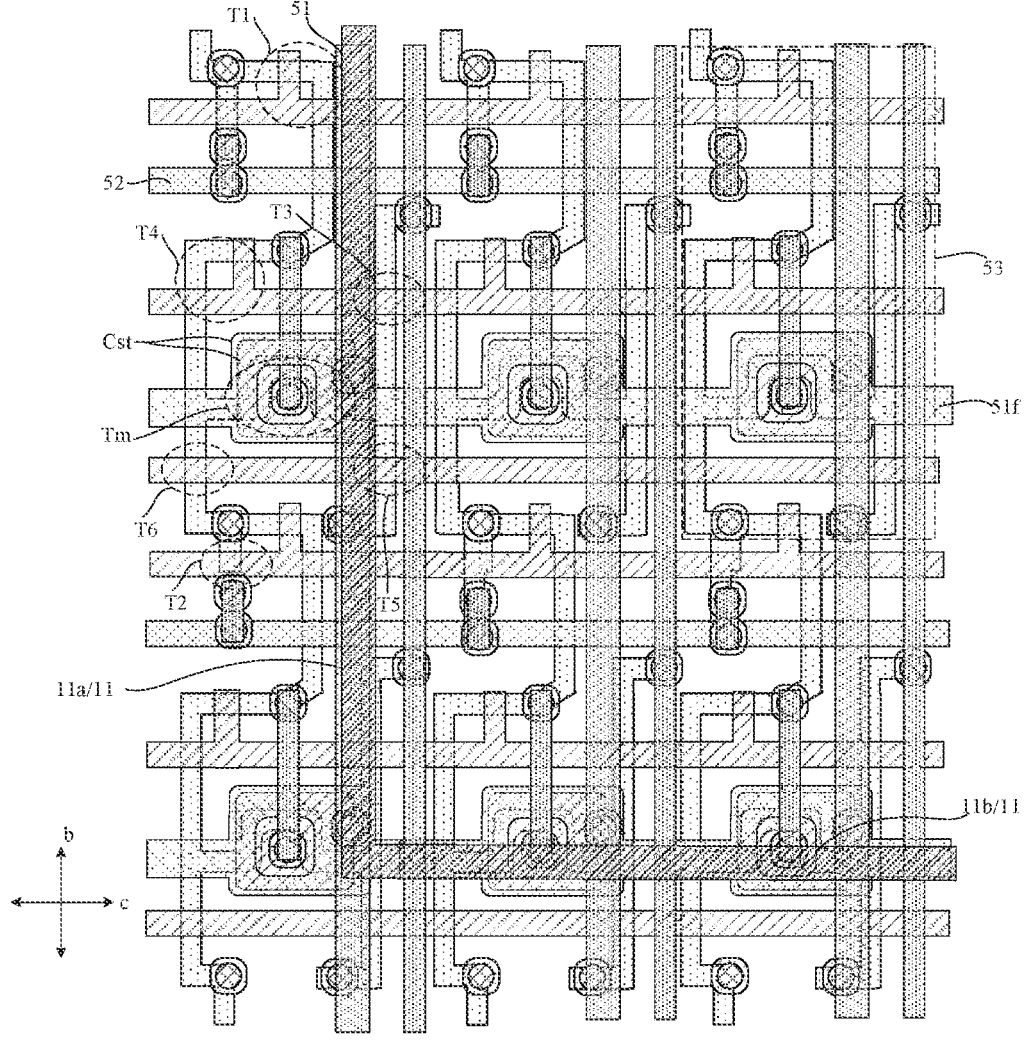
FIG. 6 is a partial schematic diagram of a display panel according to another embodiment of the present disclosure.

FIG. 6 is a partial schematic diagram of a display panel according to another embodiment of the present disclosure. As shown in FIG. 6, the display panel includes a power supply signal line 51 extending along the second direction b and a reset signal line 52 extending along the third direction c. The pixel circuit 53 is connected to the reset signal line 52 and the power supply signal line 51. FIG. 6 shows the transistors in the pixel circuit 53, and the structure of the pixel circuit 53 can be understood in conjunction with the embodiment of the FIG. 3. In the first connection line 11, the first connection segment 11a extends along the second direction b, the second connection segment 11b extends along the third direction c, and the second direction b and the third direction c intersect each other. As shown in the top view of FIG. 6, the first connection segment 11*a* at least partially overlaps the power supply signal line 51. The power supply signal line 51 transmits a fixed-potential signal, and the power supply signal line 51 is a fixed-potential signal line.

The pixel circuit 53 further includes a storage capacitor Cst. Referring to FIG. 3, a first plate of the storage capacitor Cst is connected to the power supply signal line 51, and a second plate of the storage capacitor Cst is connected to the gate electrode of the driving transistor Tm. As shown in FIG. 6, the first plates in the storage capacitors Cst adjacent along the third direction c are connected to each other to form an auxiliary power line 51*f*. The second connection segment 11*b* at least partially overlaps the auxiliary power line 51*f*. The auxiliary power line 51*f* and the power supply signal line 51 transmit the same signal, so that the auxiliary power line 51*f* is also a fixed-potential signal line.

The reset signal line 52 transmits a reset signal. In some embodiments, the reset signal is a fixed-potential signal. In some embodiments, the second connection segment 11*b* at least partially overlaps the reset signal line 52, which is not illustrated in the drawings herein.

Figure 7:
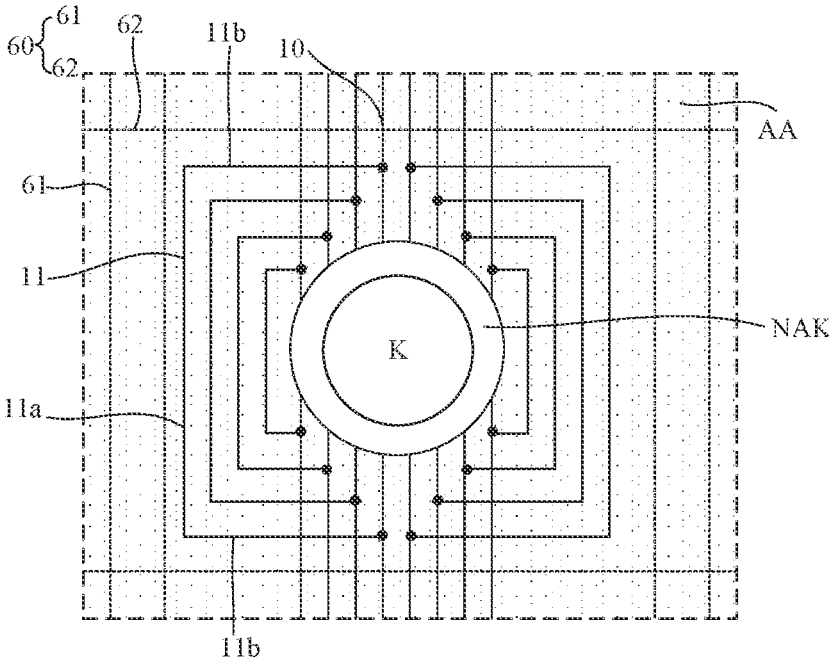
FIG. 7 is a schematic diagram of a display panel according to another embodiment of the present disclosure.

FIG. 7 is a schematic diagram of a display panel according to another embodiment of the present disclosure. In some embodiments, as shown in FIG. 7, the display region AA includes dummy lines 60. The dummy lines 60 include a first dummy line 61 and a second dummy line 62. The first dummy line 61 has a same extending direction as the first connection segment 11*a*, and the second dummy line 62 has a same extending direction as the second connection segment 11*b*. Since the first connection line 11 is located in the display region AA, the first connection line 11 can reflect ambient light, resulting in differences in reflectivity at different positions in the display region, which affects the display effect. The dummy line 60 can balance the difference in the metal-line density at different positions in the display region AA, reduce the difference in reflectivity at different positions in the display region AA, thereby improving the display effect.

In the embodiments of FIG. 7, the display region AA includes both the first dummy line 61 and the second dummy line 62 for illustration. In other embodiments, the display region AA only includes the first dummy line 61 extending in the same direction as the first connection segment 11*a*, or only includes the second dummy line 62 extending in the same direction as the second connection segment 11*b*, which is not shown in the drawings here.

In some embodiments, the dummy line 60 transmits a fixed-potential signal. Such a configuration can avoid the dummy line 60 from floating, thereby reducing signal interference.

In an embodiment, the dummy line 60 is connected to the power supply signal line, and the dummy line 60 transmits a power supply voltage signal. In another embodiment, the dummy line 60 is connected to the reset signal line, and the dummy line 60 transmits a reset signal.

In some embodiments, the first dummy line 61 and the first connection segment 11*a* are located in a same layer, and the second dummy line 62 and the second connection segment 11*b* are located in a same layer. Therefore, the first dummy line 61 and the first connection segment 11*a* can be manufactured in the same manufacturing step, and the second dummy line 62 and the second connection segment 11*b* can be manufactured in the same manufacturing step, thereby simplifying the manufacturing process.

Figure 8:
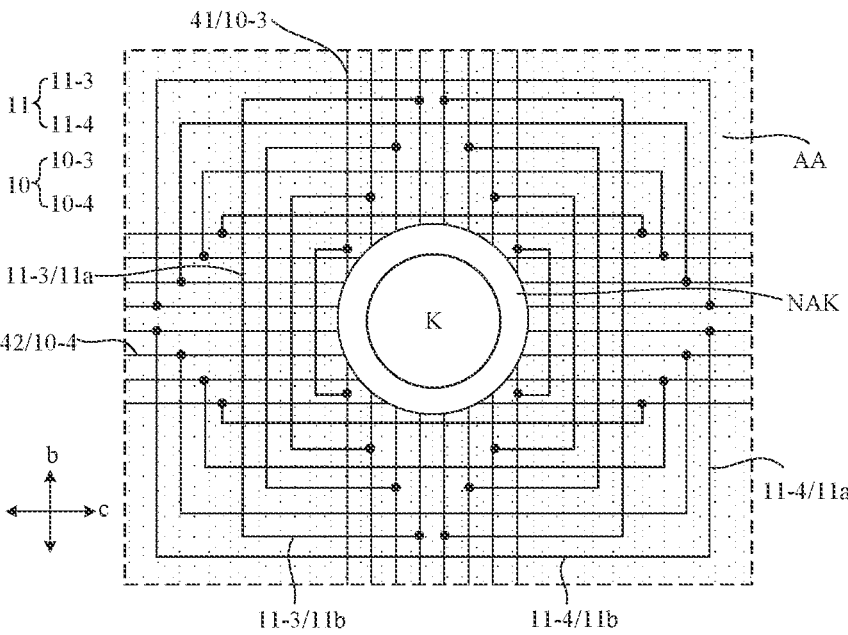
FIG. 8 is a schematic diagram of a display panel according to another embodiment of the present disclosure.

FIG. 8 is a schematic diagram of a display panel according to another embodiment of the present disclosure. In some embodiments, as shown in FIG. 8, the first connection segment 11*a* of the first connection line 11 extends along the second direction b, and the second connection segment 11*b* extends along the third direction c, where the second direction b and the third direction c intersect each other. The display panel includes data lines 41 extending along the second direction b and gate lines 42 extending along the third direction c. The first signal lines 10 include: a first type-C signal line 10-3 and a first type-D signal line 10-4, and the first connection lines 11 include a first type-C connection line 11-3 and a first type-D connection line 11-4. The first type-C signal line 10-3 is the data line 41, and the third sub-connection line 11-3 connects the first segment and the second segment of the first type-C signal line 11-3 located on two sides of the through hole K. The first type-D signal line 10-4 is the gate line 42, and the first type-D connection line 11-4 connects the first segment and the second segment of the first type-D signal line 10-4 located on two sides of the through hole K. The first type-C connection line 11-3 and the first type-D connection line 11-4 each include a first connection segment 11*a* and a second connection segment 11*b*, and the extending direction of the first connection segment 11*a* and the extending direction of the second connection segment 11*b* intersect each other.

The through hole K has a third side and a fourth side along the second direction b. On the third or fourth side of the through hole K, along the second direction b, the second connection segments 11*b* in the first type-C connection lines 11-3 are alternately arranged with the second connection segments 11*b* in the first type-D connection lines 11-4. FIG. 8 shows that the second connection segments 11*b* in the first type-C connection lines 11-3 are alternately arranged with the second connection segments 11*b* in the first type-D connection lines 11-4 one by one. In other embodiments, the second connection segments 11*b* in two adjacent first type-C connection lines 11-3 in the second direction b are spaced apart by the second connection segments 11*b* in two or more first type-D connection lines 11-4. In some embodiments, the second connection segments 11*b* in two adjacent first type-D connection lines 11-4 in the second direction b are spaced apart by the second connection segments 11*b* in two or more first type-C connection lines 11-3.

The through hole K has a first side and a second side along the third direction c. On the first or second side of the through hole K, along the third direction c, a distance between the first connection segment 11*a* in the first type-C connection line 11-3 and the through-hole K is a first distance, a distance between the first connection segment 11*a* in the first type-D connection line 11-4 and the through-hole K is a second distance, and the first distance is smaller than the second distance. In other words, along the third direction c, the first connection segment 11*a* in the first type-C connection line 11-3 is closer to the through hole K than the first connection segment 11*a* in the first type-D connection line 11-4. In other words, on a side of the through hole K in the third direction c, the distance between the first type-C connection line 11-3 and the through hole K is smaller.

FIG. 8 schematically shows that eight data lines 41 are cut by the through hole K, and eight gate lines 42 are cut by the through hole K. In an actual product, the number of gate lines 42 cut by the through hole K is much larger than the number of data lines 41 cut by the through hole K. Herein, it can be understood in conjunction with the pixel circuit illustrated in FIG. 3, and the line connected to the gate electrode of transistor in the pixel circuit can be referred to as the gate line. For a pixel circuit column extending in the second direction b, one data line can drive one pixel circuit column. For a pixel circuit row extending in the third direction c, driving one pixel circuit row includes at least the emission control line, the first scan line and the second scan line. Therefore, the number of gate line 42 cut by the through hole K is much larger than the number of data line 41 cut by the through hole K.

In the embodiments of the present disclosure, the first segment and the second segment of the data line 41 located on two sides of the through hole K are connected through the first type-C connection line 11-3 arranged in the display region AA, and the first segment and the second segment of the gate line 42 located on two sides of the through hole K are connected through the first type-D connection line 11-4 arranged in the display region AA. Neither the first type-C connection line nor the first type-D connection line 11-4 is arranged in the through-hole non-display region NAK surrounding the through-hole K, so that it is beneficial to narrowing the border of the through-hole non-display region NAK, thereby improving the display effect. In addition, on a side of the through hole K in the third direction c, a distance between the first type-C connection line 11-3 and the through-hole K is set to be smaller, it is beneficial to reducing the length of the first type-C connection line 11-3, and is beneficial to reducing the length difference among various first type-C connection lines 11-3, i.e., it is beneficial to reducing the load difference among various data lines 41. In the second direction b, the second connection segments 11b in the first type-C connection lines 11-3 are alternately arranged with the second connection segments 11b in the first type-D connection lines 11-4, so that along the third direction c the longer second connection segments 11b (belonging to the first type-D connection lines 11-4) are spaced apart by the shorter second connection segments 11b (belonging to the first type-C connection lines 11-3). That is, longer connection segments and shorter connection segments are alternately arranged in the display region AA. With such a configuration, the refection of the second connection segments 11b on one side of the through hole K can have a certain transition in the reflection of ambient light, which can improve the display visual effect.

In other embodiments, as shown in FIG. 5, the through hole K has a third symmetry axis Z3 that is parallel to the extending direction of the data line 41, and a fourth symmetry axis Z4 that is parallel to the extending direction of the gate line 42. The through hole K has a first side and a second side along the third direction c. On the first side or the second side of the through hole K in the third direction c, along the third direction c, a distance between the first connection segment 11a of the first type-C connection line 11-3 and the through-hole K is a first distance, a distance between the first connection segment 11a of the first type-D connection line 11-4 and the through-hole K is a second distance, and the first distance is smaller than the second distance. A distance from the first connection segment 11a to the third symmetry axis Z3 along the third direction c is the distance between the first connection segment 11a and the through hole K. The through hole K has a third side and a fourth side along the second direction b. On the third side or the fourth side of the through hole K, along the second direction b, a distance between the second connection segment 11b in the first type-C connection line 11-3 and the through hole K is a third distance, a distance between the second connection segment 11b in the first type-D connection line 11-4 and the through hole K is a fourth distance, and the third distance is smaller than the fourth distance. A distance from the second connection segment 11b to the fourth symmetry axis Z4 along the second direction b represents a distance between the second connection segment 11b to the through hole K. In some embodiments, on the third or fourth side of the through hole K in the third direction c, the distance between the first connection segment 11a of the first type-C connection line 11-3 and the through hole K is set to be smaller. On the third or fourth side of the through hole K in the second direction b, the distance between the second connection segment 11b in the first type-C connection line 11-3 and the through hole K is set to be smaller. Such a configuration helps to reduce the length of the first type-C connection line 11-3, and thus helps to reduce the length difference among the various first type-C connection lines 11-3, that is, it helps to reduce the load difference among the various data lines 41, thereby improving the display uniformity.

The third symmetry axis Z3 and the fourth symmetry axis Z4 of the through hole K defined in the embodiments of FIG. 5 are named according to the relationship between the extending direction of the symmetry axis and the extending direction of a certain signal line in the display panel. In the embodiments of FIG. 2, one symmetry axis that has the same extending direction as the first signal line 10 is named as the first symmetry axis Z1. It can be understood that when the data line 41 is the first signal line 10, the third symmetry axis Z3 and the first symmetry axis Z1 are the same symmetry axis.

Figure 9:
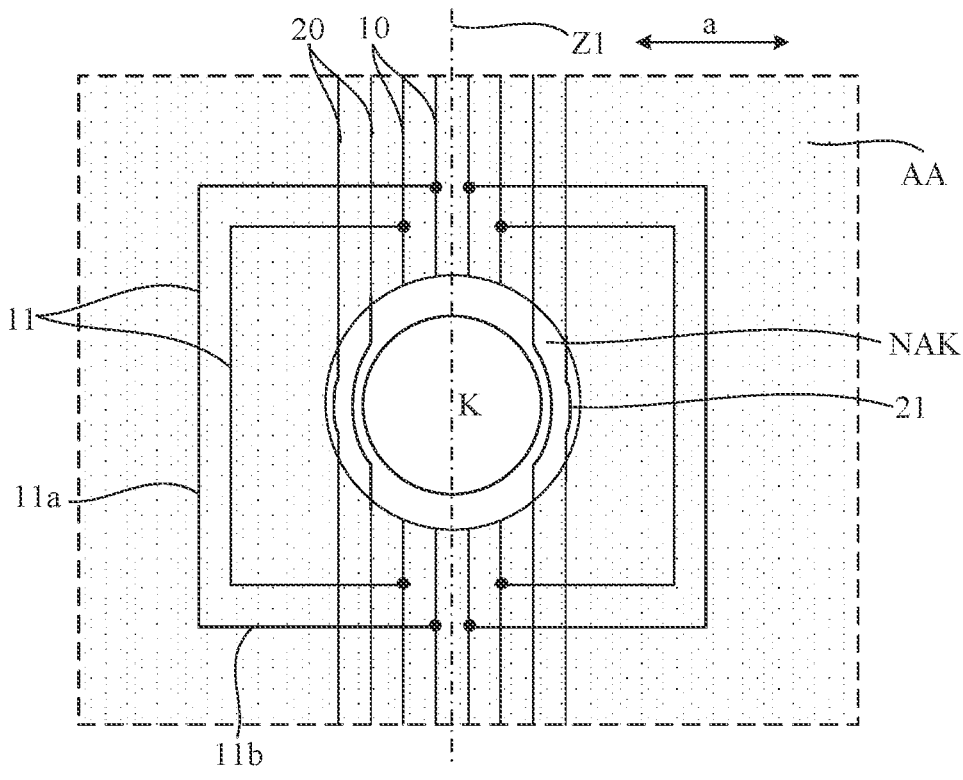
FIG. 9 is a schematic diagram of a display panel according to another embodiment of the present disclosure.

FIG. 9 is a schematic diagram of a display panel according to another embodiment of the present disclosure. In some embodiments, as shown in FIG. 9, the display panel includes a display region AA and a through-hole non-display region NAK. The display region AA has a through-hole K. The through-hole non-display region NAK surrounds the through-hole K. The display region AA surrounds the through-hole non-display region NAK. The display panel includes first signal lines 10 and second signal lines 20. Both the first signal lines 10 and the second signal lines 20 extend in the display region AA and are cut by the through-hole non-display region NAK. For example, each first signal line 10 includes a first segment and a second segment located on two sides of the through-hole non-display region NAK, and each second signal line 20 includes a first segment and a second segment located on two sides of the through-hole non-display region NAK. The extending directions of the first signal line 10 and the second signal line 20 can be the same or different. FIG. 9 shows an example in which the extending directions of the first signal line 10 and the second signal line 20 are the same for illustration. Signal lines extending in the same direction as the first signal lines 10 but not cut by the through hole K are provided in the display region AA, which are not shown in FIG. 9.

The display panel includes first connection lines 11 located in the display region AA and second connection lines 21 located in the through-hole non-display region NAK. The first connection line 11 has a first end connected to the first segment of the first signal line 10 located on one side of the through hole, and a second end connected to the second segment of the first signal line 10 located on an opposite other side of the through hole. The second connection line 21 has a first end connected to the first segment of the second signal line 20 located on one side of the through hole K, and a second end connected to the second segment of the second signal line 20 located on an opposite side of the through hole K. The first segment and the second segment of the first signal line 10 connected to each other through the first connection lines 11 are connected to the pixel circuits located in the same pixel circuit row or the same pixel circuit column. The first segment and the second segment of the second signal line 20 connected to each other through the second connection line 21 are connected to the pixel circuits located in the same pixel circuit row or the same pixel circuit column.

In the display panel provided by the embodiments of the present disclosure, the through hole K is provided in the display region AA, and both the first signal line 10 and the second signal line 20 include two segments located on two sides of the through hole K. The first segment and the second segment of the first signal line 10 located on two sides of the through hole K are connected by the first connection line 11 in the display region AA, and the first segment and the second segment of the second signal line 20 located on two sides of the through hole K are connected by the second connection line 21 in the through-hole non-display region NAK. That is to say, a connection line (including the first connection line 11 and the second connection line 21) is used to connect two segments of the signal line on two sides of the through hole K to provide transmission of voltage signals on the signal line. Moreover, the first connection line 11 is provided in the display region AA, and the second connection line 21 is provided in the through-hole non-display region NAK, which can reduce the number of lines in the through-hole non-display region NAK, narrow the through-hole non-display region NAK and reduce the width of border around the through hole K. Furthermore, it can reduce the number of lines in the display region AA, and reduce the reflection of ambient light by the metal lines in the display region AA. The embodiments of the present disclosure comprehensively considers the influence of the connection lines on the width of the through-hole non-display region NAK and the influence of the connection lines in the display region AA on the reflectivity of the display panel, thereby balancing the two to improve the display effect.

In some embodiments, as shown in FIG. 9, the extending direction of the second signal line 20 is the same as the extending direction of the first signal line 10. If the connection lines of both the first signal line 10 and the second signal line 20 are located in the through-hole non-display region NAK, a larger number of connection lines will be arranged in the through-hole non-display region NAK, which affects the width of the through-hole non-display region NAK. If the connection lines of both the first signal line 10 and the second signal line 20 are located in the display region AA, a larger number of connection lines will be arranged in the display region AA, which increases the reflectivity of the display panel to ambient light. In the embodiments of the present disclosure, the first segment and the second segment of the first signal line 10 located on two sides of the through hole K are connected through the first connection line 11 in the display region AA, and the first segment and the second segment of the second signal lines 20 located on two sides of the through hole K are connected through the second connection line 21 in the through-hole non-display region NAK, so that the influence of the connection line on the width of the through-hole non-display region NAK and the influence of the connection line in the display region AA on the reflectivity of the display panel are comprehensively considered, thereby balancing the two aspects to improve the display effect.

In some embodiments, as shown in FIG. 9, the through hole K has a first symmetry axis Z1. When the extending direction of the first symmetry axis Z1 is the same as the extending direction of the first signal line 10, and the extending direction of the second signal line 20 is the same as the extending direction of the first signal line 10, the extending direction of the first symmetry axis Z1 is also the same as the extending direction of the second signal line 20. The second connection lines 21 located on two sides of the first symmetry axis Z1 are equal in quantity, and the first connection lines 11 located on two sides of the first symmetry axis Z1 are equal in quantity. With such a configuration, the through-hole non-display region NAK has equal width on two sides of the first symmetry axis Z1, and the density of the first connection lines 11 in the display region AA on two sides of the first symmetry axis Z1 is the same, so that the difference in reflectivity of the display region AA on two sides of the first symmetry axis Z1 can be reduced, thereby improving the display effect. In addition, the configuration of the embodiments also helps to reduce the load difference between the signal lines on two sides of the first symmetry axis Z1, and reduce the display brightness difference of the display region AA on two sides of the first symmetry axis Z1, thereby improving the display uniformity.

Figure 10:
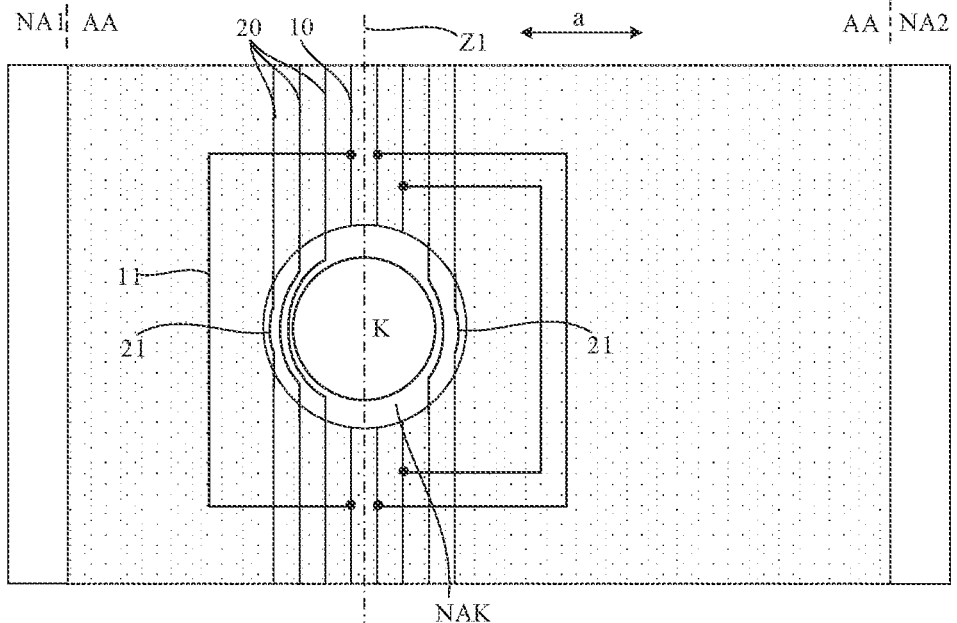
FIG. 10 is a schematic diagram of a display panel according to another embodiment of the present disclosure.

FIG. 10 is a schematic diagram of a display panel according to another embodiment of the present disclosure. In other embodiments, as shown in FIG. 10, the display panel includes a first non-display region NA1 and a second non-display region NA2. In a first direction a, the first non-display region NA1 and the second non-display region NA2 are respectively located on two sides of the display region AA, and the first direction a and the extending direction of the first signal line 10 intersect each other. In the first direction a, a distance between the through hole K and the first non-display region NA1 is smaller than a distance between the through hole K and the second non-display region NA2. The through hole K has a first symmetry axis Z1, and an extending direction of the first symmetry axis Z1 is the same as an extending direction of the first signal line 10. The number of first connection line 11 arranged between the first non-display region NA1 and the through hole K is n1, the number of first connection line 11 arranged between the second non-display region NA2 and the through hole K is n2, and n1≤n2. The number of the second connection line 21 located on a side of the first symmetry axis Z1 adjacent to the first non-display region NA1 is n3, the number of the second connection line 21 located on a side of the first symmetry axis Z1 adjacent to the second non-display region NA2 is n4, and n3≥n4. The number of the signal lines and the number of the connection lines in FIG. 10 are only for schematic representation. In FIG. 10, n1<n2, and n3>n4 are shown for illustration. In addition, each of n1, n2, n3, and n4 is an integer.

Since the distance between the through hole K and the first non-display region NA1 is relatively short in the first direction a, the display region AA between the through hole K and the first non-display region NA1 is limited, so that the number of the first connection lines 11 that can be arranged in the display region AA between the through hole K and the first non-display region NA1 is limited. In some embodiments, n1<n2 and n3>n4 can be set, that is, compared to the side of the through hole K adjacent to the second non-display region NA2, the number of the first connection lines 11 arranged between the first non-display region NA1 and the through hole K is smaller, and the number of the second connection lines 21 located on the side of the first symmetry axis Z1 adjacent to the first non-display region NA1 is larger, so that the two segments of the signal line cut by the through hole K on the side of the first symmetry axis Z1 adjacent to the first non-display region NA1 are connected through the first connection line 11 or the second connection line 21. The influence of the connection lines on the width of the through-hole non-display region NAK and the influence of the connection lines in the display region AA on the reflectivity of the display panel are comprehensively considered, thereby balancing the two aspects to improve the display effect.

In some embodiments, as shown in FIG. 10, the through hole K has a first symmetry axis Z1, and the extending direction of the first symmetry axis Z1 is the same as the extending direction of the first signal line 10. On one of two sides of the first symmetry axis Z1 along the first direction a, the distance between the first signal line 10 and the first symmetry axis Z1 along the first direction a is smaller than a distance between the second signal line 20 and the first symmetry axis Z1 along the first direction a. The first direction a and the extending direction of the first signal line 10 intersect each other. On one side of the first symmetry axis Z1, since the distance between the first signal line 10 and the first symmetry axis Z1 is relatively short, a total length of the two segments of the first signal line 10 on two sides of the through hole K in the display region AA is smaller than a total length of the two segments of the second signal line 20 on two sides of the through hole K. In some embodiments of the present disclosure, the two segments of the first signal line 10 on two sides of the through hole K are connected by the first connection line 11, the two segments of the second signal line 20 on two sides of the through hole K are connected by the second connection line 21, and the first connection line 11 is arranged in the display region AA, so that the length of the first connection line 11 is greater than the length of the second connection line 21, and the electrical resistance of the first connection line 11 is greater than the electrical resistance of the second connection line 21. Such a configuration helps to balance the load difference between the first signal line 10 and the second signal line 20, thereby improving the display uniformity.

Figure 11:
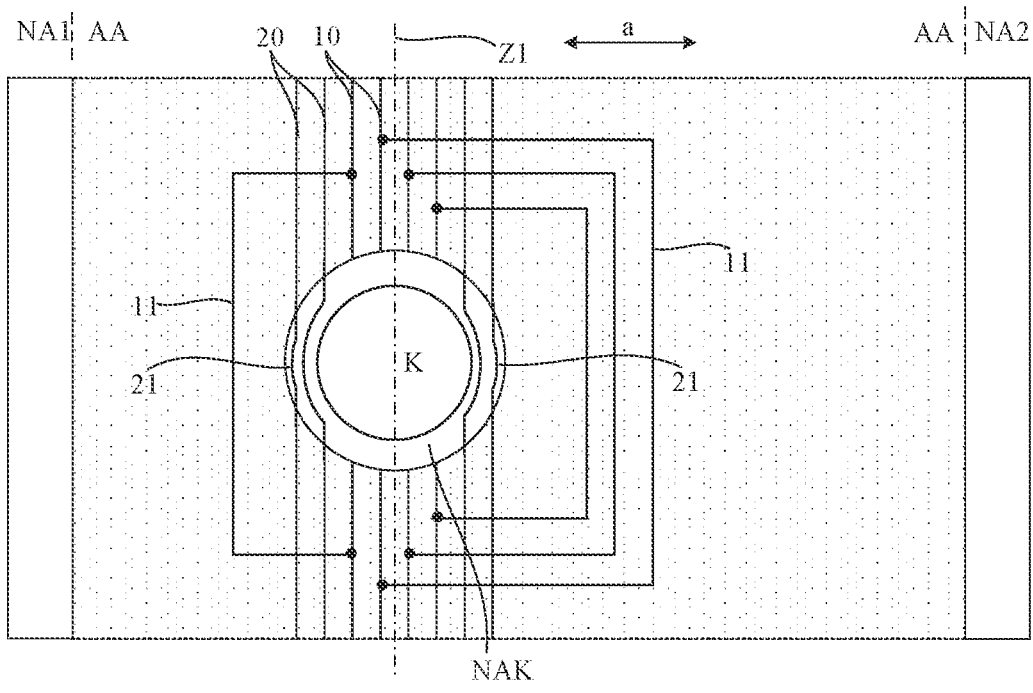
FIG. 11 is a schematic diagram of a display panel according to another embodiment of the present disclosure.

In other embodiments, n1+n3<n2+n4. FIG. 11 is a schematic diagram of a display panel according to another embodiment of the present disclosure. As shown in FIG. 11, the number of first connection line 11 arranged between the through hole K and the first non-display region NA1 is smaller than the number of first connection line 11 arranged between the through hole K and the second non-display region NA2. The number of the second connection line 21 located on a side of the first symmetry axis Z1 adjacent to the first non-display region NA1 are the same to the number of the second connection line 21 located on a side of the first symmetry axis Z1 adjacent to the second non-display region NA2. With such a configuration, n1+n3<n2+n4. This arrangement helps to realize that the widths of the through-hole non-display region NAK on two sides of the through-hole K in the first direction a are approximately the same, and more first connection lines 11 are arranged on the display region AA on the side of the through-hole K adjacent to the second non-display region NA2. That is to say, more first connection lines 11 are arranged in a part of the display region AA on a side of the through hole K having a larger area than another part, it helps to realize the uniformity of the pattern density of the first connection lines 11 in the display region AA, and avoid a difference in pattern density in the display region AA on two sides of the through hole K. The a difference in pattern density may cause a large difference in reflectivity of ambient light at the two parts of the display region AA on two sides of the through hole K, and affects the display effect.

Figure 12:
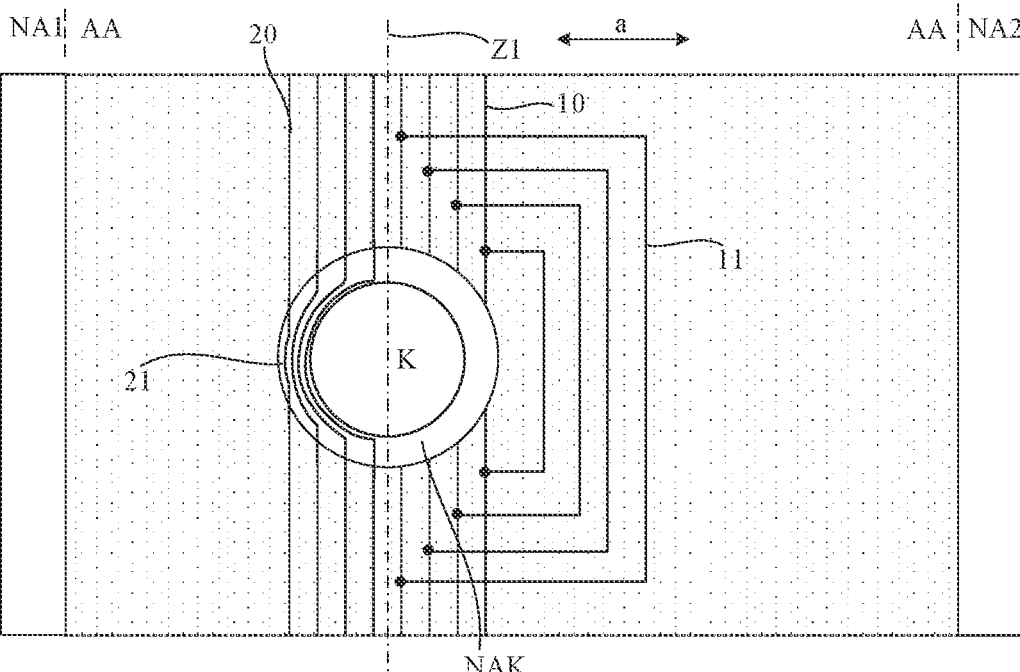
FIG. 12 is a schematic diagram of a display panel according to another embodiment of the present disclosure.

In other embodiments, n1=0, and/or, n4=0. FIG. 12 is a schematic diagram of a display panel according to another embodiment of the present disclosure. As shown in FIG. 12, the first connection line 11 is not provided between the through hole K and the first non-display region NA1, that is, n1=0. The second connection line 21 is not provided on a side of the first symmetry axis Z1 adjacent to the second non-display region NA2, that is, n4=0.

In some implementations, the display panel provided by the embodiments of the present disclosure includes a first functional signal line and a second functional signal line that have different extending directions. At least one of the first functional signal line or the second functional signal line includes a first signal line and a second signal line.

Figure 13:
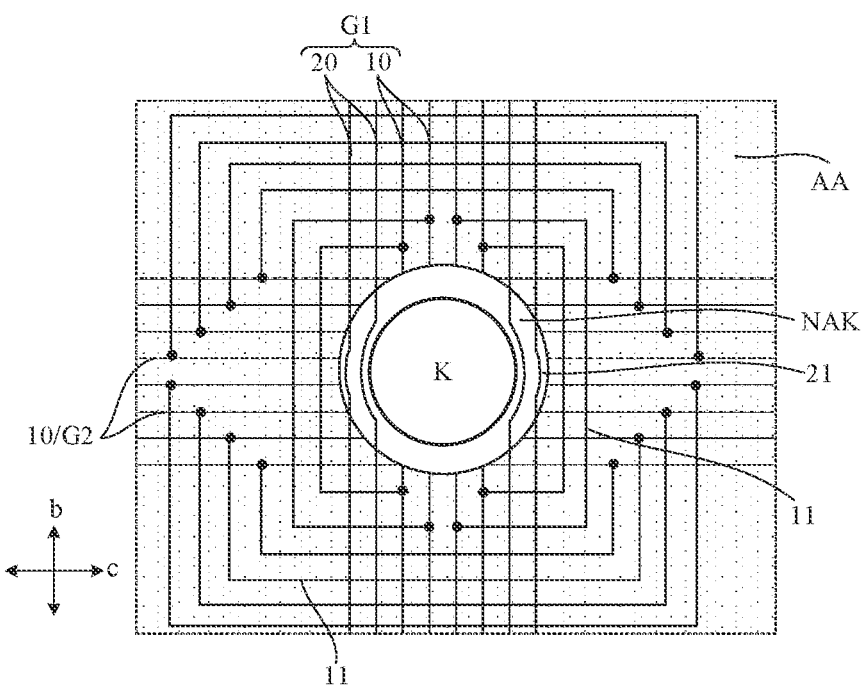
FIG. 13 is a schematic diagram of a display panel according to another embodiment of the present disclosure.

FIG. 13 is a schematic diagram of a display panel according to another embodiment of the present disclosure. As shown in FIG. 13, the display panel includes a first functional signal line G1 and a second functional signal line G2 that have different extending directions. The first functional signal line G1 includes the first signal line 10 and the second signal line 20. Two segments of the first signal lines 10 located on two sides of the through hole K are connected by the first connection line 11 in the display region AA, and two segments of the second signal line 20 located on two sides of the through hole K are connected by the second connection line 21 in the through-hole non-display region NAK. The second functional signal line G2 includes only the first signal line 10, and the two segments of the first signal line 10 on two sides of the through hole K are connected by the first connection line 11 in the display region AA. FIG. 13 shows that the first functional signal line G1 extends along the second direction b, and the second functional signal line G2 extends along the third direction c. For at least one first functional signal line G1 cut by the through hole K, the two segments of the first functional signal line G1 are connected by the first connection line 11 located in the display region AA. For another at least one first functional signal line G1 cut by the through hole K, the two segments of the first functional signal line G1 are connected through the second connection line 21 located in the through-hole non-display region NAK. The combined design of the first connection line 11 and the second connection line 21 comprehensively considers the influence of the connection lines on the width of the through-hole non-display region NAK and the influence of the connection lines in the display region AA on the reflectivity of the display panel, thereby balancing the two aspects to improve the display effect.

Figure 14:
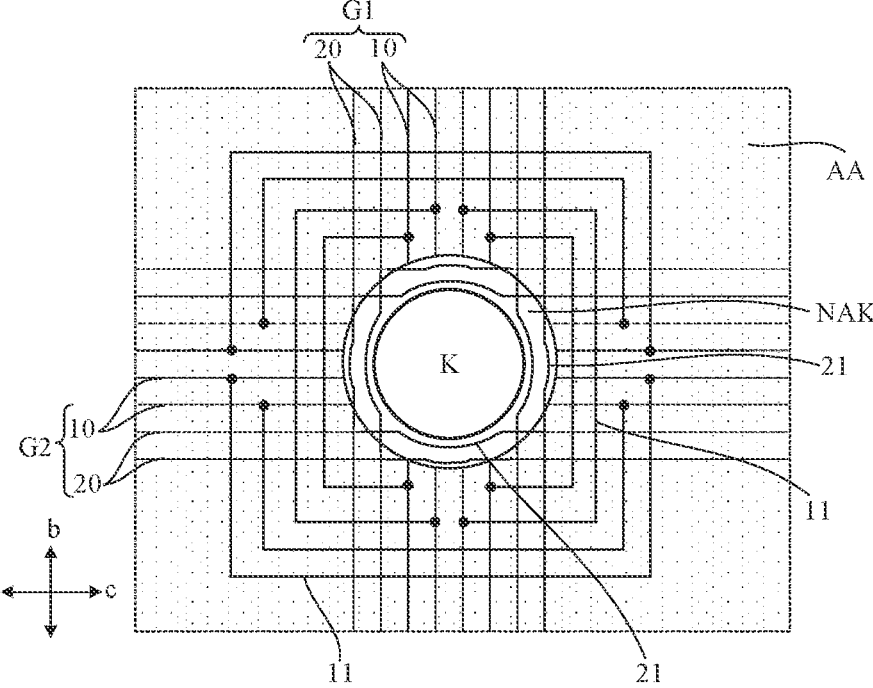
FIG. 14 is a schematic diagram of a display panel according to another embodiment of the present disclosure.

In other embodiments, FIG. 14 is a schematic diagram of a display panel according to another embodiment of the present disclosure. As shown in FIG. 14, the first functional signal line G1 includes the first signal line 10 and the second signal line 20, and the second functional signal line G2 also includes the first signal line 10 and the second signal line 20.

Figure 15:
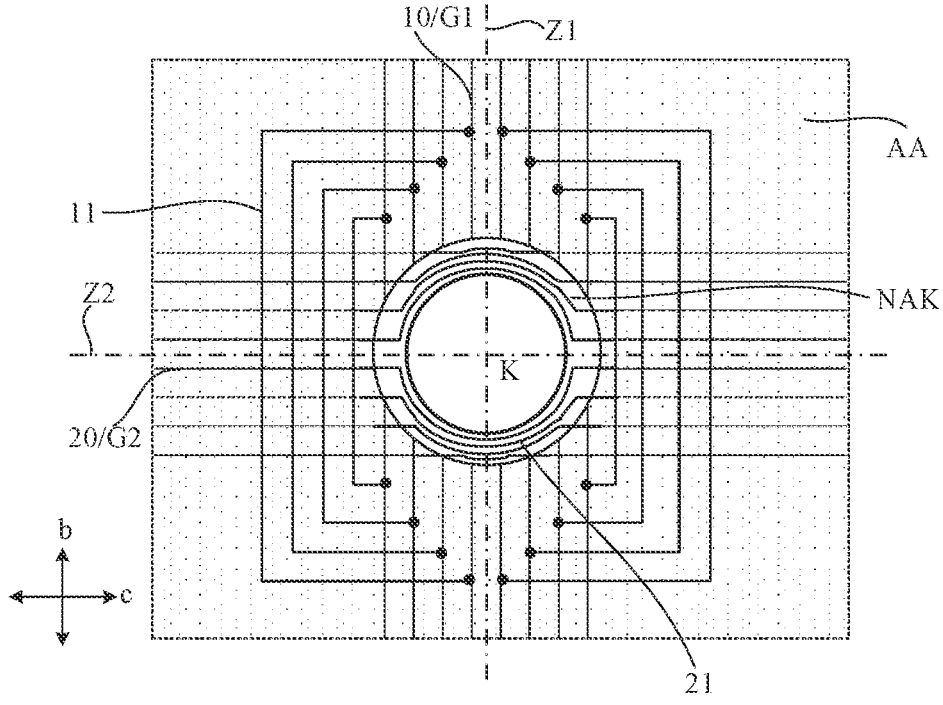
FIG. 15 is a schematic diagram of a display panel according to another embodiment of the present disclosure.

In other embodiments, FIG. 15 is a schematic diagram of a display panel according to another embodiment of the present disclosure. As shown in FIG. 15, the display panel includes a first functional signal line G1 and a second functional signal line G2 that have different extending directions. The first functional signal line G1 includes the first signal line 10, and the second functional signal line G2 includes the second signal line 20. It is illustrated that the first functional signal line G1 extends along the second direction b, and the second functional signal line G2 extends along the third direction c. In some embodiments, two segments of the first functional signal lines G1 cut by the through hole K are connected by the first connection line 11, and two segments of the second functional signal lines G2 cut by the through hole K are connected by the second connection line 21, so that for the signal lines cut by the through hole K and having the same extending direction, their two segments are connected by the same connection manner, thereby improving the load consistency of the signal lines with the same extending directions.

In an embodiment, the first functional signal line G1 includes a data line, and the second functional signal line G2 includes a gate line and an emission control line.

In another embodiment, the second functional signal line G2 includes a data line, and the first functional signal line G1 includes a gate line and an emission control line.

As shown in FIG. 15, the through hole K has a first symmetry axis Z1. The extending direction of the first symmetry axis Z1 is the same as the extending direction of the first signal line 10. The first connection lines 11 located on two sides of the first symmetry axis Z1 are equal in quantity. Such a configuration helps to improve the pattern density uniformity of the first connection line 11 on two sides of the through hole K, and can reduce the difference in the reflectivity of the ambient light by the display regions AA on two sides of the through hole K.

As shown in FIG. 15, the through hole K has a second symmetry axis Z2. The extending direction of the second symmetry axis Z2 is the same as the extending direction of the second signal line 20. The second connection lines 2 located on two sides of the second symmetry axis Z2 are equal in quantity. Such arrangement helps to improve the consistency of widths of two parts of the through-hole non-display region NAK located on two sides of the through-hole K.

Figure 16:
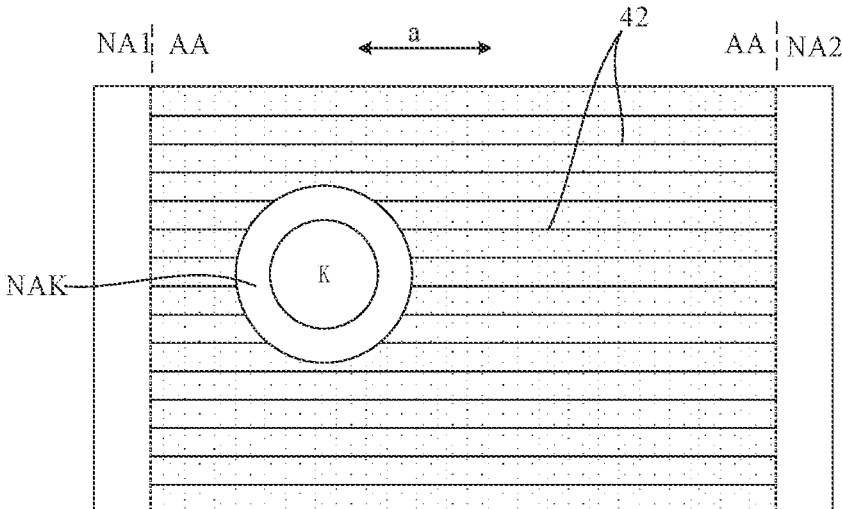
FIG. 16 is a schematic diagram of a display panel according to another embodiment of the present disclosure.

In some embodiments, FIG. 16 is a schematic diagram of a display panel according to another embodiment of the present disclosure. As shown in FIG. 16, the display panel includes a first non-display region NA1 and a second non-display region NA2. In the first direction a, the first non-display region NA1 and the second non-display region NA2 are respectively located on two sides of the display region AA, and the first direction a is the same as the extending direction of the gate line 42. In the first direction a, the distance between the through hole K and the first non-display region NA1 is smaller than the distance between the through hole K and the second non-display region NA2. In this embodiment, the through hole K is closer to the first non-display region NA1 in the first direction a, and the through hole K is located at a position to the central left as seen from FIG. 16. FIG. 16 shows that some gate lines 42 are cut by the through hole K in the extending direction of the gate lines 42, but does not show how the gate lines 42 on two sides of the through hole K are connected. In some embodiments, the gate lines 42 include the first signal line 10 and/or the second signal line 20. That is, in some embodiments, the two segments of the gate line 42 located on two sides of the through hole K are connected by the first connection line 11 arranged in the display region AA. In other embodiments, the two segments of the gate line 42 located on two sides of the through hole K are connected by the second connection line 21 arranged in the through-hole non-display region NAK. In other embodiments, two segments of one gate line 42 located on two sides of the through hole K are connected by the second connection line 21 arranged in the through-hole non-display region NAK, and two segments of another one gate line 42 located on two sides of the through hole K are connected by the first connection line 11 arranged in the display region AA.

Figure 17:
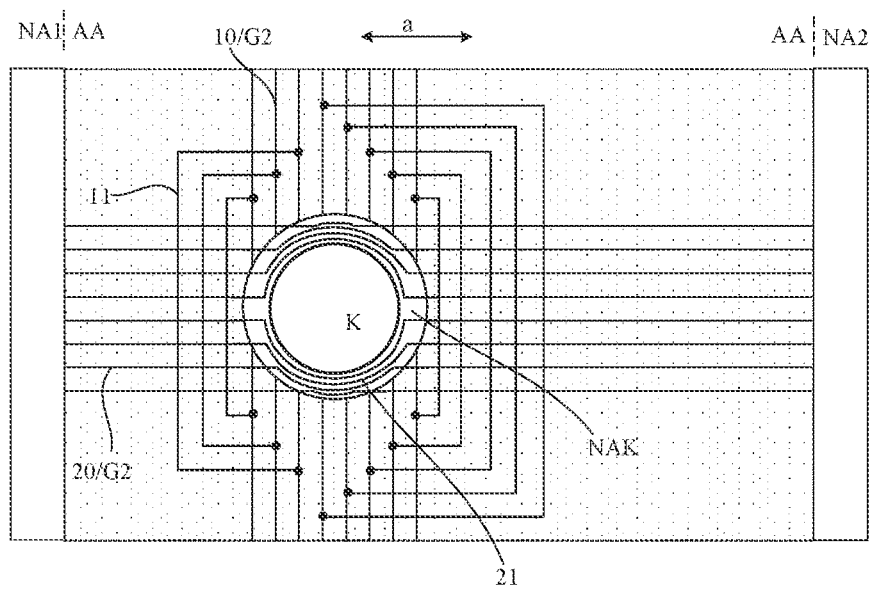
FIG. 17 is a schematic diagram of a display panel according to another embodiment of the present disclosure.

In other embodiments, the first connection lines 11 arranged in two parts of the display regions AA on two sides of the through hole K in the first direction a are different in quantity. FIG. 17 is a schematic diagram of a display panel according to another embodiment of the present disclosure. As shown in FIG. 17, the display panel includes a first functional signal line G1 and a second functional signal line G2 that have different extending directions. The first functional signal line G1 includes a first signal line 10, and the second functional signal line G2 include a second signal line 20. The display panel includes a first non-display region NA1 and a second non-display region NA2. In the first direction a, the first non-display region NA1 and the second non-display region NA2 are respectively located on two sides of the display region AA, and the first direction a and the extending direction of the first signal line 10 intersect each other. In the first direction a, the distance between the through hole K and the first non-display region NA1 is smaller than the distance between the through hole and the second non-display region NA2. The number of the first connection line 11 arranged between the first non-display region NA1 and the through hole K is n1, and the number of the first connection line 11 between the second non-display region NA2 and the through hole K is n2, where n1<n2. Since the distance between the through hole K and the first non-display region NA1 is relatively small, the part of the display regions AA between the through hole K and the first non-display region NA1 is relatively small, and the number of the first connection line 11 arranged between the first non-display region NA1 and the through hole K is relatively small, and the number of the first connection line 11 can be set according to the sizes of the display region AA on two sides of the through hole K, it helps to realize the uniformity of the wiring density of the first connection lines 11 in the display region AA on two sides of the through hole K in the first direction, and avoid the excessive large density of the first connection lines 11 arranged on one side of the through hole K, which makes the reflectivity difference of the display region AA on two sides of the through hole K vary greatly to affect the display effect. In addition, in this embodiment, two segments of the second functional signal line G2 cut by the through hole K are connected by the second connection line 21, and the second connection lines 21 arranged on two sides of the through hole K are equal in quantity, which helps achieve the consistency borders of two parts of the through-hole non-display regions NAK on two sides of the through-hole K.

Figure 18:
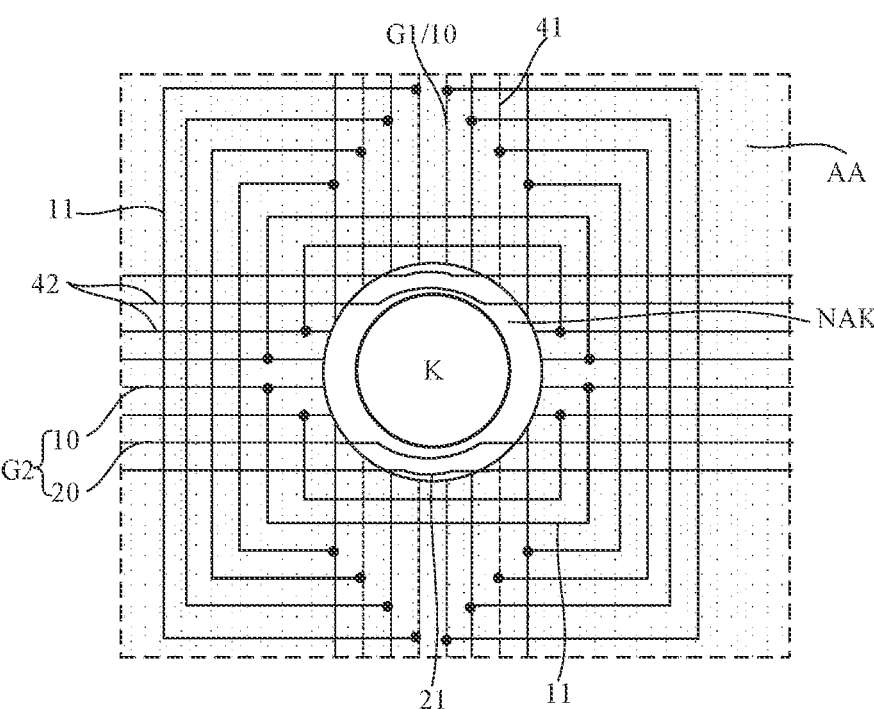
FIG. 18 is a schematic diagram of a display panel according to another embodiment of the present disclosure.

In some embodiments, FIG. 18 is a schematic diagram of a display panel according to another embodiment of the present disclosure. As shown in FIG. 18, the display panel includes a first functional signal line G1 and a second functional signal line G2 that have different extending directions. The functional signal line G1 includes a first signal line 10, and the second functional signal line G2 includes a first signal line 10 and a second signal line 20. The first functional signal line G1 is a data line 41, and the second functional signal line G2 is a gate line 42. FIG. 18 schematically shows that eight data lines 41 are cut by the through hole K, and eight gate lines 42 are cut by the through hole K. Referring to the pixel circuit illustrated in FIG. 3 above, it can be understood that the lines connected to the gate electrodes of the transistors in the pixel circuit can be referred to as gate lines. The gate lines 42 at least include a scan line and an emission control line. Driving one pixel circuit row includes at least three gate lines: the emission control line, the first scan line and the second scan line. Therefore, in an actual product, the number of the gate lines 42 cut by the through hole K is much larger than the number of the data lines 41 cut by the through hole K. The second functional signal line G2 is set to include the first signal line 10 and the second signal line 20, so that for some gate lines 42 cut by the through hole K, their two segments are connected through the first connection line 11 in the display region AA, and for some gate lines 42 cut by the through hole K, their two segments are connected through the second connection line 21 in the through-hole non-display region NAK, which is equivalent to distributing the connection lines in the through-hole non-display region NAK and the display region AA around the through-hole K. With such a configuration, the width of the through-hole non-display region NAK will not be too large, and the metal pattern density in the display region AA will not be too large, so that narrowing the width of the through-hole non-display region NAK and reducing the reflection of the ambient light can be balanced.

Figure 19:
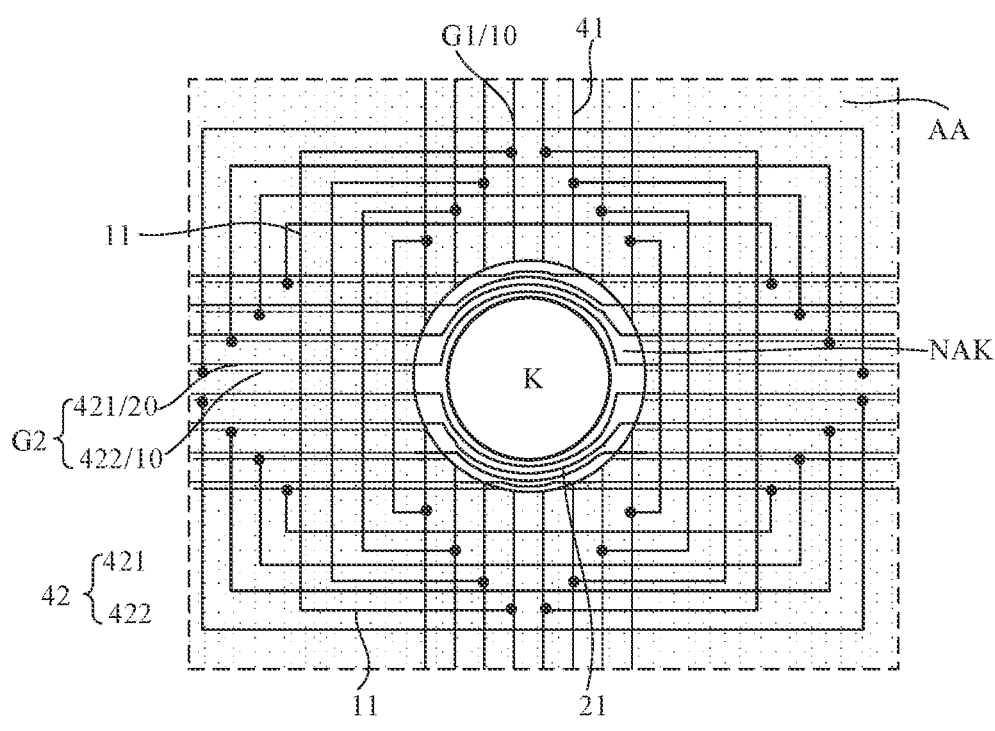
FIG. 19 is a schematic diagram of a display panel according to another embodiment of the present disclosure.

In some embodiments, FIG. 19 is a schematic diagram of a display panel according to another embodiment of the present disclosure. As shown in FIG. 19, the gate lines 42 include a scan line 421 and an emission control line 422. The scan line 421 and the emission control line 422 are alternately arranged. The scan line 421 includes a second signal line 20, that is, two segments of the scan line 421 located on two sides of the through hole K are connected by the second connection line 21 in the through-hole non-display region NAK. In some embodiments, the scan line 421 includes a first scan line and a second scan line. The emission control line 422 includes the first signal line 10. The two segments of the emission control line 422 on two sides of the through hole K are connected through the first connection line 11 in the display region AA. Although the scan line 421 and the emission control line 422 extend in the same direction, they transmit different signals. In the embodiments of the present disclosure, for the emission control lines 422 cut by the through hole K, their two segments are connected in the same connection manner, which can reduce the load difference between the signal lines of the same type, thereby improving the display uniformity. In addition, the number of gate lines is large, and connection is generally realized by the first metal layer, or the second metal layer defined in the embodiments of the present disclosure. If all of them use a Fanout in Active Area (FIAA, that is, wiring in the display region) configuration, punching to the fourth metal layer or the fifth metal layer is used. The punched holes are deeper and are many, which occupy a larger area, and short circuit and other phenomena occur easily. Among the connection lines corresponding to the gate lines, some connection lines run in the display region and some connection lines run in the non-display region, so that the difficulty of punching is reduced, thereby improving the efficiency of connection, and reducing the load difference between signal lines of the same type.

In other embodiments (not shown in the drawings), the scan line 421 includes the first signal line 10, and the emission control line 422 includes the second signal line 20.

As shown in FIG. 9, the display region AA includes first signal lines 10 and second signal lines 20. Two segments of the first signal line 10 located on two sides of the through hole K are connected by the first connection line 11 in the display region AA, and two segments of the second signal line 20 located on two sides of the through hole K are connected through the second connection line 21 in the through-hole non-display region NAK. The first connection line 11 includes a first connection segment 11a and a second connection segment 11b that have different extending directions. At least one of the first connection segment 11a or the second connection segment 11b is located in a different layer from the first signal line 11. FIG. 9 shows that the extending direction of the first connection segment 11a is the same as the extending direction of the first signal line 10, and the extending direction of the second connection segment 11b and the extending direction of the first signal line 10 intersect each other. Setting at least one of the first connection segment 11a or the second connection segment 11b in the first connection line 11 to be located in a different layer from the first signal line 10 can reduce the occupation of the original layer of the display panel by the first connection line 11, and help define the density of pixel circuits arranged in the display panel, so that that the density of display pixels is not affected.

In some embodiments, the first connection segment 11a and the first signal line 11 are located in a same layer, and the second connection segment 11b and the first signal line 11 are located in different layers. The first connection segment 11a and the first signal line 10 can be manufactured in the same manufacturing step. The second connection segment 11b can be manufactured in the same manufacturing step as other functional structures in the display panel, or an additional conductive film can be added in the display panel to manufacture the second connection segment 11b.

In other embodiments, the first connection segment 11a is located in a different layer from the first signal line 11, and the second connection segment 11b is located in a different layer from the first signal line 11. The first connection segment 11a and the second connection segment 11b are located in a same layer or different layers.

As shown in FIG. 4, the display panel includes a first metal layer 01, a second metal layer 02, a third metal layer 03, a fourth metal layer 04 and a fifth metal layer 05, which are located on a side of the substrate 00 and are arranged away from the substrate 00 in sequence. In some embodiments, one of the first connection segment 11a and the second connection segment 11b is located in the fourth metal layer 04, and the other of the first connection segment 11a and the second connection segment 11b is located in the fifth metal layer 05. Referring to FIG. 19, when the first functional signal line G1 includes one first signal line 10, and the second functional signal line G2 having a different extending direction from the first functional signal line G1 includes another first signal line 10, it is necessary to arrange first connection lines 11 for transmitting different signals in the display region AA. At this time, the first connection segment 11a and the second connection segment 11b in the first connection line 11 are located in different metal layers, which can avoid the short circuit between the first connection line 11 for connecting the first functional signal line G1 and the first connection line 11 for connecting the second functional signal line G2.

Figure 20:
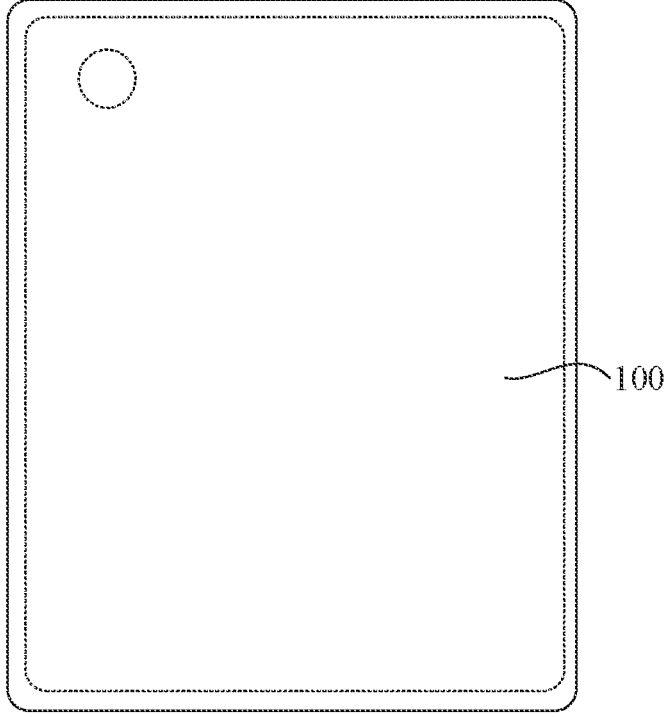
FIG. 20 is a schematic diagram of a display apparatus according to an embodiment of the present disclosure.

Based on the same inventive concept, the present disclosure further provides a display apparatus. FIG. 20 is a schematic diagram of the display apparatus according to an embodiment of the present disclosure. As shown in FIG. 20, the display apparatus includes the display panel 100 provided by any embodiment of the present disclosure. The structure of the display panel has been described in the above embodiments, which will not be elaborated here. The display apparatus provided by the embodiments of the present disclosure can be, for example, an electronic device such as a mobile phone, a computer, a TV, a tablet computer, and a smart wearable device.

The above are merely preferred embodiments of the present disclosure, which, as mentioned above, are not configured to limit the present disclosure. Whatever within the principles of the present disclosure, including any modification, equivalent substitution, improvement, etc., shall fall into the protection scope of the present disclosure.

Finally, it should be noted that the technical solutions of the present disclosure are illustrated by the above embodiments, but not intended to limit thereto. Although the present disclosure has been described in detail referring to the foregoing embodiments, those skilled in the art can understand that the present disclosure is not limited to the specific embodiments described herein, and can make various obvious modifications, readjustments, and substitutions without departing from the scope of the present disclosure.

What is claimed is:

1. A display panel, comprising:

a display region defining a through hole;

a first signal line;

a first connection line, wherein the first signal line extends in the display region and is interrupted by the through hole into a first segment and a second segment located on two sides of the through hole along an extending direction of the first signal line, respectively; wherein the first connection line is located in the display region, and comprises a first end connected to the first segment of the first signal line, and a second end connected to the second segment of the first signal line; and wherein the first connection line comprises a first connection segment and a second connection segment that defining different extending directions, and at least one of the first connection segment or the second connection segment is located in a layer different from the first signal line;

a through-hole non-display region, wherein the through-hole non-display region surrounds the through hole, and the display region surrounds the through-hole non-display region;

a second signal line located in the display region and extending in the display region, wherein the second signal line is interrupted by the through-hole non-display region; and a second connection line located in the through-hole non-display region, wherein a first end of the second connection line is connected to a first segment of the second signal line located on one side of the through-hole non-display region, and a second end of the second connection line is connected to a second segment of the second signal line located on an opposite side of the through-hole non-display region.

2. The display panel according to claim 1, wherein the through hole comprises a first side and a second side along a first direction intersecting the extending direction of the first signal line, the first connection line comprises a first connection line located on the first side of the through hole and a first connection line located on the second side of the through hole, and a number of the first connection line located on the first side of the through hole is equal to a number of the first connection line located on the second side of the through hole.

3. The display panel according to claim 1, wherein the through hole comprises a first side and a second side along a first direction intersecting the extending direction of the first signal line, the first connection line comprises a first connection line located on the first side of the through hole and a first connection line located on the second side of the through hole, and a number of the first connection line located on the first side of the through hole is different from a number of the first connection line located on the second side of the through hole.

4. The display panel according to claim 3, further comprising a first non-display region and a second non-display region, wherein the first non-display region and the second non-display region are respectively located on two sides of the display region along the first direction;

wherein a distance between the through hole and the first non-display region along the first direction is smaller than a distance between the through hole and the second non-display region along the first direction; and wherein the first connection line all detours between the second non-display region and the through hole.

5. The display panel according to claim 1, further comprising: a first non-display region and a second non-display region;

wherein the first non-display region and the second non-display region are respectively located on a first side and a second side of the display region along the first direction;

wherein a distance between the through hole and the first non-display region along the first direction is smaller than a distance between the through hole and the second non-display region along the first direction; and wherein the first connection line comprises a first connection line detouring between the first non-display region and the through hole and a first connection line detouring between the second non-display region and the through hole, and a number $n1$ of the first connection line detouring between the first non-display region and the through hole is less than a number $n2$ of the first connection line detouring between the second non-display region and the through hole.

6. The display panel according to claim 1, wherein an extending direction of the second signal line is the same as the extending direction of the first signal line.

7. The display panel according to claim 6, wherein the through hole defines a first symmetry axis, and the first symmetry axis is parallel to the extending direction of the first signal line; and wherein the second connection line comprises a second connection line located on a first side of the first symmetry axis and a second connection line located on a second side of the first symmetry axis, and a number of the second connection line located on the first side of the first symmetry axis is equal to a number of the second connection line located on the second side of the first symmetry axis.

8. The display panel according to claim 6, further comprising a first non-display region and a second non-display region, wherein the first non-display region and the second non-display region are respectively located on two sides of the display region along the first direction, and the first direction and the extending direction of the first signal line intersect each other;

wherein a distance between the through hole and the first non-display region along the first direction is smaller than a distance between the through hole and the second non-display region along the first direction;

wherein the through hole defines a first symmetry axis, and the first symmetry axis is parallel to the extending direction of the first signal line; and wherein the second connection line comprises: a second connection line located on a side of the first symmetry axis adjacent to the first non-display region and a second connection line located on a side of the first symmetry axis adjacent to the second non-display region, and a number $n3$ of the second connection line located on the side of the first symmetry axis adjacent to the first non-display region is greater than or equal to a number n4 of the second connection line located on the side of the first symmetry axis adjacent to the second non-display region.

9. The display panel according to claim 6, wherein the through hole defines a first symmetry axis, and the first symmetry axis is parallel to the extending direction of the first signal line; and wherein, on a side of the first symmetry axis, a distance between the first signal line and the first symmetry axis along a first direction is greater than a distance between the second signal line and the first symmetry axis along the first direction, and the first direction and the extending direction of the first signal line intersect each other.

10. The display panel according to claim 1, wherein one of the first connection segment and the second connection segment is located in a same layer as the first signal line.

11. The display panel according to claim 10, further comprising: a substrate, a first metal layer, a second metal layer, a third metal layer, a fourth metal layer, and a fifth metal layer, wherein the first metal layer, the second metal layer, the third metal layer, the fourth metal layer, and the fifth metal layer are located on a side of the substrate and are arranged away from the substrate in sequence, wherein the first signal line comprises a data line, the first signal line and the first connection segment are located in a same layer; and wherein one of the first connection segment and the second connection segment is located in the fourth metal layer, the other of the first connection segment and the second connection segment is located in the fifth metal layer.

12. The display panel according to claim 11, further comprising a first non-display region and a second non-display region, wherein the first non-display region and the second non-display region are respectively located on two sides of the display region along a first direction, and the first direction and an extending direction of the first signal line intersect each other;

along the first direction, a distance between the through hole and the first non-display region is smaller than a distance between the through hole and the second non-display region; and the first connection line comprises a first connection line detouring between the first non-display region and the through hole and a first connection line detouring between the second non-display region and the through hole, and a number n1 of the first connection line detouring between the first non-display region and the through hole is less than a number n2 of the first B connection line detouring between the second non-display region and the through hole.

13. The display panel according to claim 1, wherein the first connection segment and the second connection segment are located in a same layer that is different from a layer of the first signal line.

14. The display panel according to claim 1, wherein the first connection segment extends along a second direction, the second connection segment extends along a third direction, and the second direction and the third direction intersect each other;

wherein the display panel further comprises a data line extending along the second direction and a gate line extending along the third direction;

wherein the first signal line comprises a first type-C signal line and a first type-D signal line, the first type-C signal line is the data line, the first type-D signal line is the gate line; and the first connection line comprises a first type-C connection line and a first type-D connection line; wherein the first type-C connection line connects the first segment and the third segment of the first type-C signal line that are located on two sides of the through hole along the second direction respectively, and the first type-D connection line connects the first segment and the third segment of the first type-D signal line that are located on a first side and a second side of the through hole along the third direction respectively; and wherein the first connection segment in the first type-C connection line and the first connection segment in the first type-D connection line are located in a same layer, and the second connection segment in the first type-C connection line and the second connection segment in the first type-D connection line are located in a same layer.

15. The display panel according to claim 1, wherein the first connection segment extends along a second direction, the second connection segment extends along a third direction, and the second direction and the third direction intersect each other;

wherein the display panel further comprises a data line extending along the second direction and a gate line extending along the third direction;

wherein the first signal line comprises a first type-C signal line and a first type-D signal line, the first type-C signal line is the data line, the first type-D signal line is the gate line, the first connection line comprises a first type-C connection line and a first type-D connection line, the first type-C connection line connects the first segment and the second segment of the first type-C signal line that are located on two sides of the through hole along the second direction respectively, and the first type-D connection line connects the first segment and the second segment of the first type-D signal line that are located on two sides of the through hole along the third direction respectively;

wherein, on one of the two sides of the through hole along the second direction, the second connection segment in the first type-C connection line is alternately arranged with the second connection segment in the first type-D connection line; and wherein, on one of the two sides of the through hole along the third direction, a distance between the first connection segment in the first type-C connection line and the through hole along the third direction is a first distance, a distance between the first connection segment in the first type-D connection line and the through hole along the third direction is a second distance, and the first distance is smaller than the second distance.

16. The display panel according to claim 1, wherein the first connection segment extends along a second direction, the second connection segment extends along a third direction, and the second direction and the third direction intersect each other;

wherein the display panel further comprises a data line extending along the second direction and a gate line extending along the third direction;

wherein the first signal line comprises a first type-C signal line and a first type-D signal line, the first type-C signal line is the data line, the first type-D signal line is the gate line, the first connection line comprises a first type-C connection line and a first type-D connection line, the first type-C connection line connects the first segment and the second segment of the first type-C signal line that are respectively located on two sides of the through hole along the second direction, and the first type-D connection line connects the first segment and the second segment of the first type-D signal line that are respectively located on two sides of the through hole along the third direction;

wherein, on one of the two sides of the through hole along the third direction, a distance between the first connection segment in the first type-C connection line and the through hole along the third direction is a first distance, a distance between the first connection segment in the first type-D connection line and the through hole along the third direction is a second distance, and the first distance is smaller than the second distance; and wherein, on one of the two sides of the through hole along the second direction, a distance between the second connection segment in the first type-C connection line and the through hole is a third distance along the second direction, a distance between the second connection segment in the first type-D connection line and the through hole is a fourth distance along the second direction, and the third distance is smaller than the fourth distance.

17. The display panel according to claim 1, further comprising a dummy line located in the display region, wherein the dummy line comprises at least one of: a first dummy line or a second dummy line, and wherein the first dummy line and the first connection segment extend along a same direction, and the second dummy line and the second connection segment extend along a same direction.

18. The display panel according to claim 17, wherein the dummy signal line transmits a fixed-potential signal.

19. The display panel according to claim 18, wherein the first dummy line and the first connection segment are located in a same layer, and the second dummy line and the second connection segment are located in a same layer.

20. A display apparatus, comprising a display panel, wherein the display panel comprises:
   a display region defining a through hole;
   a first signal line;
   a first connection line, wherein the first signal line extends in the display region and is interrupted by the through hole into a first segment and a second segment that are located on two sides of the through hole, respectively; wherein the first connection line is located in the display region, and comprises a first end connected to the first segment of the first signal line, and a second end connected to the second segment of the first signal line; and wherein the first connection line has a first connection segment and a second connection segment that comprise different extending directions, and at least one of the first connection segment or the second connection segment is located in a different layer from the first signal line;
   a through-hole non-display region, wherein the through-hole non-display region surrounds the through hole, and the display region surrounds the through-hole non-display region;
   a second signal line located in the display region and extending in the display region, wherein the second signal line is interrupted by the through-hole non-display region; and
   a second connection line located in the through-hole non-display region, wherein a first end of the second connection line is connected to a first segment of the second signal line located on one side of the through-hole non-display region, and a second end of the second connection line is connected to a second segment of the second signal line located on an opposite side of the through-hole non-display region.

\* \* \* \* \*